United States Patent
Sakata

(10) Patent No.: US 6,707,839 B1
(45) Date of Patent: Mar. 16, 2004

(54) OPTICAL SEMICONDUCTOR DEVICE AND PROCESS FOR PRODUCING THE SAME

(75) Inventor: Yasutaka Sakata, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/721,662

(22) Filed: Nov. 27, 2000

(30) Foreign Application Priority Data

Nov. 26, 1999 (JP) ............................................. 11-335951

(51) Int. Cl.$^7$ ................................................. H01S 5/12
(52) U.S. Cl. ............................................ 372/96; 372/50
(58) Field of Search ............................ 372/50, 96, 97, 372/23, 102

(56) References Cited

U.S. PATENT DOCUMENTS

| | | | | |
|---|---|---|---|---|
| 3,970,958 A | * | 7/1976 | Streifer et al. | 372/96 |
| 4,993,036 A | * | 2/1991 | Ikeda et al. | 372/50 |
| 5,295,150 A | * | 3/1994 | Vangieson et al. | 372/96 |
| 5,930,278 A | * | 7/1999 | Menigaux | 372/50 |
| 5,953,359 A | * | 9/1999 | Yamaguchi et al. | 372/50 |
| 5,982,804 A | * | 11/1999 | Chen et al. | 372/96 |
| 2001/0005391 A1 | * | 6/2001 | Sakata | 372/43 |

FOREIGN PATENT DOCUMENTS

| | | |
|---|---|---|
| JP | 03-110884 A | 5/1991 |
| JP | 03-110885 A | 5/1991 |

* cited by examiner

*Primary Examiner*—Paul Ip
*Assistant Examiner*—James Menefee
(74) *Attorney, Agent, or Firm*—Sughrue Mion, PLLC

(57) ABSTRACT

A resist is coated on a substrate. The resist is exposed to a pattern of a plurality of diffraction gratings for setting pitches corresponding respectively to oscillation wavelengths for the plurality of semiconductor lasers and for setting heights of the diffraction gratings which provide an identical coupling coefficient independently of the oscillation wavelengths. The substrate is etched in such a manner that the level of etching per unit time is identical. A stripe mask is patterned according to the arrangement of the diffraction gratings. A laser active layer is formed on each of the diffraction gratings by selective MOVPE growth. An electrode is formed on each of the laser active layer on its top surface and the backside of the substrate. By virtue of this constitution, an optical semiconductor device and a process for producing the same can be realized which, when a plurality of semiconductor lasers are simultaneously formed on a single semiconductor substrate, can prevent a variation in coupling coefficient.

4 Claims, 19 Drawing Sheets

$d_{GTG1}$:
HEIGHT OF DIFFRACTION GRATING BEFORE SELECTIVE MOVPE GROWTH $d_{GTG2}$:
HEIGHT OF DIFFRACTION GRATING AFTER SELECTIVE MOVPE GROWTH $W_{LD}$: MASK WIDTH
$W_{MOD}$: MASK WIDTH $d_{GTG2}$ HEIGHT OF DIFFRACTION GRATING AFTER SELECTIVE MOVPE GROWTH $W_{LD}$: MASK WIDTH
$W_{MOD}$: MASK WIDTH p-ELECTRODE 214
SiO₂ 213
CAP LAYER 212
CLADDING 211
BLOCK LAYER 209
BLOCK LAYER 208
p-InP LAYER 206
MQW LAYER/BARRIER 205
GUIDE LAYER 204
SUBSTRATE 201
n-ELECTRODE 215

OPTICAL SEMICONDUCTOR DEVICE AND PROCESS FOR PRODUCING THE SAME

FIELD OF THE INVENTION

The invention relates to an optical semiconductor device and a process for producing the same. More particularly, the invention relates to an optical semiconductor device for use in WDM (wavelength division multiplexing) transmission, comprising a plurality of semiconductor lasers with different oscillation wavelengths which have been simultaneously formed on a single substrate, and a process for producing the same.

BACKGROUND OF THE INVENTION

In recent years, attention has been drawn to optical communication as means for coping with a rapidly increasing demand for communication. In this connection, a WDM optical communication system has attracted attention, because this system can transmit optical signals with different wavelengths over a single optical fiber to realize high capacity communication over a single optical fiber. WDM is a system wherein, on a transmitter side, a plurality of different wavelengths (n wavelengths: $\lambda_1$ to $\lambda_n$) are multiplexed in an optical multiplexer to perform wavelength multiplexing on a single optical fiber, followed by transmission, while on a receiver side, information from the optical fiber is demultiplexed in an optical demultiplexer to wavelengths $\lambda_1$ to $\lambda_n$. The realization of WDM requires, for example, the stabilization of laser wavelengths, the development of optical circuit devices, and the integration of optical circuits. Further, in the WDM optical communication system, a plurality of light sources corresponding respectively to the wavelengths $\lambda_1$ to $\lambda_n$ are required. Accordingly, what is required here is to efficiently realize light sources respectively with different wavelengths. To cope with this, Japanese Patent Laid-Open No. 117040/1998 discloses a production process wherein a plurality of DFB (distributed feedback) lasers with different wavelengths and a plurality of EA (electro-absorption) modulators, which have been integrated with each other, are simultaneously prepared within a plane of a single semiconductor substrate. According to the production process disclosed in Japanese Patent Laid-Open No. 117040/1998, in order to provide a plurality of different oscillation wavelengths on a single semiconductor substrate, diffraction gratings with different periods (pitches $A_1, A_2 \ldots A_n$) are formed by electron beam exposure and etching, and multi-layer structures each comprising an active layer (a light absorption layer) with a band gap wavelength according to the oscillation wavelength are then prepared by selective MOVPE (metal-organic vapor phase epitaxy).

FIG. 33 shows an optical semiconductor device disclosed in Japanese Patent Laid-Open No. 117040/1999. As shown in FIG. 33A, at the outset, 16 phase-shift diffraction gratings 302 with different periods are successively formed on an n-type InP substrate 301 in its stripe region by electron beam (EB) exposure and etching. The pitch of the diffraction gratings 302 is varied to $\lambda_1, \lambda_2,$ and $\lambda_3$ in the order of an increase in the pitch. Next, a striped SiO$_2$ mask 303 as an insulation layer for selective growth is formed in the direction of [011]. This SiO$_2$ mask 303 is formed on the diffraction grating 302 so as to have a striped window region having a predetermined width. In this case, the mask width is varied according to the pitch of the diffraction grating 302. Thereafter, as shown in FIG. 33B, an n-type InGaAsP guide layer 304, an InGaAsP/InGaAsP-MQW (multiple quantum well) active layer 305, and a p-type InP cladding 306 are formed in that order by selective MOVPE growth in a region between the SiO$_2$ masks 303. The multilayer semiconductor layer formed in the region between the SiO$_2$ masks 303 functions as an optical waveguide. In FIG. 33B, a semiconductor layer formed between masks with different widths is not shown in the drawing for the simplification of the structure.

Next, the opening width of the SiO$_2$ mask 303 around the striped optical waveguide is widened. Thereafter, as shown in FIG. 33C, a p-type InP buried layer 307 is formed again by selective MOVPE growth. In FIG. 33C, as with FIG. 33B, the semiconductor layer formed between the SiO$_2$ masks 303 with different widths is not shown in the drawing.

Next, an SiO$_2$ layer 300 is formed on the assembly except for the top of the ridge structural multilayer semiconductor including the MQW active layer 305, and, as shown in FIG. 33D, a metal electrode 309 is formed on the surface of the InP substrate 301, while a metal electrode 310 is formed on the backside of the InP substrate 301. The metal electrode 309 formed on the surface of the InP substrate 301 is separated for insulation between the devices. Thereafter, the wafer is cleaved at an interval of the semiconductor laser device length. An antireflection (AR) coating is applied onto the cleaved end face to complete semiconductor lasers.

According to the process shown in FIG. 33, the band gap wavelength of the oscillation wavelength can be made identical to the band gap wavelength of the laser active layer in a given range (detuning). Therefore, this process features that the homogeneity of the threshold of laser oscillation and the oscillation efficiency can be kept relatively good. The preparation of the active layer by selective MOVPE, however, leads to a change in band gap wavelength of the optical guide layer formed on the diffraction grating and, in addition, a change in thickness of the active layer. The change in the band gap wavelength of the guide layer leads to a change in absolute value of the refractive index on the diffraction grating. This in turn leads to a change in level of a periodic refractive index change by diffraction gratings. Further, a change in thickness of the active layer leads to a change in an optical confinement factor in the active layer. This results in a change in light intensity in the diffraction grating region. The level of the periodic refractive index change due to the diffraction grating and the light intensity of the diffraction grating region are parameters involved directly in coupling coefficient κ (which represents the relationship of coupling where reflection occurs in the diffraction grating to couple a traveling wave with a back wave and is a parameter as an index for resonant characteristics). Therefore, in the simultaneous formation of lasers with different wavelengths wherein the level of the refractive index change and the light intensity in the diffraction grating region are varied, the coupling coefficient κ is varied according to the oscillation wavelength.

Here an optical semiconductor device produced by the production process shown in FIG. 33 will be discussed. (1) The increase in the widths ($W_{nm1}$ to $W_{nm3}$) of the masks for selective growth to increase the oscillation wavelength increases the band gap wavelength of the optical guide layer on the diffraction grating. This increases the absolute value of the refractive index of the optical guide layer. As a result, the coupling coefficient κ is increased. (2) Since the thickness of the active layer is increased, the coefficient of light confining in the active layer is increased. Thus, the light intensity in the diffraction grating region is reduced, and the coupling coefficient κ is reduced. The relationship between the oscillation wavelength (or the width of mask for selective growth) and the coupling coefficient κ varies depending upon the relationship between the magnitude in (1) and the magnitude in (2) (which depends upon an MOVPE apparatus for growth of crystal or growth conditions). This coupling coefficient κ is a parameter which is closely related, for example, to the oscillation threshold of DFB laser, luminous efficiency, yield of longitudinal single mode, and long-distance transmission characteristics.

According to the conventional optical semiconductor device and production process, however, since the coupling coefficient κ varies for each DFB oscillation wavelength, the threshold current of laser oscillation and the luminous efficiency become heterogeneous. This heterogeneity results in lowered yield of devices.

Further, since the coupling coefficient κ varies for each DFB, the resistance to the residual reflection of the end face varies from device to device. This poses a problem that, in the case of long-distance transmission, the yield of transmission characteristics varies according to the wavelength.

SUMMARY OF THE INVENTION

Accordingly, it is an object of the invention to provide an optical semiconductor device and a process for producing the same which can suppress a variation in coupling coefficient caused by the simultaneous formation of a plurality of semiconductor lasers on a single semiconductor substrate, can homogenize the threshold of laser oscillation, luminous efficiency, and long-distance transmission characteristics, and can improve the yield.

In order to attain the above object of the invention, according to the first feature of the invention, an optical semiconductor device comprises a plurality of semiconductor lasers which oscillate longitudinal single mode laser beams based on a periodic change in refractive index or a periodic change in gain and have been simultaneously formed with mutually different oscillation wavelengths on a single substrate, said plurality of semiconductor lasers being identical to each other in coupling coefficient independently of the oscillation wavelength.

By virtue of this construction; unlike the conventional optical semiconductor device which comprises semiconductor lasers, having an identical construction, simultaneously formed on a single substrate and varies in coupling coefficient for each oscillation wavelength, for the optical semiconductor device of the invention, the coupling coefficient of the semiconductor lasers is identical despite the fact that the semiconductor lasers are different from each other in oscillation wavelength. Therefore, the optical semiconductor device of the invention is free from the heterogeneity of the threshold current of laser oscillation and the luminous efficiency, and, thus, the lowering in yield of semiconductor laser devices can be prevented. Further, in long-distance transmission, a variation in yield of the transmission characteristics depending upon the wavelength can be prevented.

In order to attain the above object of the invention, according to the second feature of the invention, an optical semiconductor device comprises a plurality of semiconductor lasers which oscillate longitudinal single mode laser beams based on a periodic change in refractive index or a periodic change in gain and have been simultaneously formed with mutually different oscillation wavelengths on a single substrate, said plurality of semiconductor lasers being provided with diffraction gratings having heights corresponding respectively to the oscillation wavelengths.

According to this construction, the height of the diffraction grating is regulated in such a manner that, despite the fact that the semiconductor lasers are different from each other in oscillation wavelength, the coupling coefficient of the semiconductor lasers is identical. As a result, since the coupling coefficient of the semiconductor lasers is identical despite the fact that the semiconductor lasers are different from each other in oscillation wavelength, the optical semiconductor device is free from the heterogeneity of the threshold current of laser oscillation and the luminous efficiency, and, thus, the lowering in yield of semiconductor laser devices can be prevented. Further, in long-distance transmission, a variation in yield of the transmission characteristics depending upon the wavelength can be prevented.

In order to attain the above object of the invention, according to the third feature of the invention, a process for producing an optical semiconductor device comprising a plurality of semiconductor lasers which oscillate longitudinal single mode laser beams with different wavelengths and have been simultaneously formed on a single substrate, comprises the steps of:

coating a resist on the substrate;

exposing the surface of the resist to a pattern of a plurality of diffraction gratings for setting pitches corresponding respectively to oscillation wavelengths for the plurality of semiconductor lasers and for setting heights which provide an identical coupling coefficient independently of the oscillation wavelength;

etching the coating in such a manner that the level of etching per unit time is identical;

patterning a stripe mask to give a predetermined shape according to the arrangement of the diffraction gratings;

forming a laser active layer an each of' the diffraction gratings using the $SiO_2$ mask having a predetermined shape by selective MOVPE growth (metal-organic vapor phase epitaxy);

forming an electrode on each of the top surface of the laser active layer and the backside of the substrate.

According to this production process, in forming a plurality of semiconductor lasers with a plurality of diffraction gratings on a substrate, the height of each diffraction grating is set so that the coupling coefficient is identical for the semiconductor lasers, followed by the formation of laser active layers respectively on the diffraction gratings. By virtue of the control of the height of the diffraction gratings, for the diffraction gratings on the single substrate, the coupling coefficient is identical. Therefore, the optical semiconductor device is free from the heterogeneity of the threshold current of laser oscillation and the luminous efficiency, and, thus, the lowering in yield of semiconductor laser devices can be prevented. Further, in long-distance transmission, a variation in yield of the transmission characteristics depending upon the wavelength can be prevented.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be described in conjunction with the accompanying drawings.

The present inventor has studied on the behavior of various properties of an optical semiconductor device upon a change in mask width and coupling coefficient κ. As a result, regarding the relationship between the mask width and the coupling coefficient κ and the DFB oscillation wavelength, the present inventor could have found an important fact which contributes to the invention, and the present inventor has found a method which can render the coupling coefficient κ identical despite the fact that the oscillation wavelength is different for each DFB. Further, the present inventor could have found several methods for improving the characteristics of the optical semiconductor device. Before describing the preferred embodiments, these findings will be explained with reference to the accompanying drawings.

Figure 1:
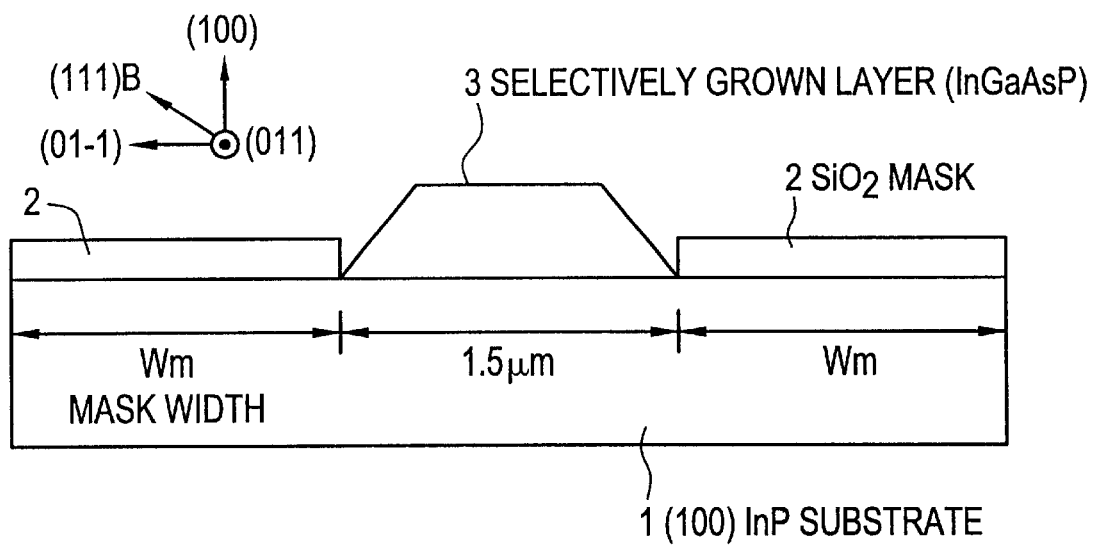
FIG. 1 is a cross-sectional view of InGaAsP grown by selective MOVPE.

FIG. 1 is a cross-sectional view of InGaAsP grown by selective MOVPE. The selective growth of an InGaAsP layer 3 on a (100) InP substrate 1 by MOVPE using a pair of $SiO_2$ stripe masks 2 with a predetermined, spacing (1.5 μm) provided there between in the direction of [011] provides the growth of a trapezoidal crystal surrounded by the (111)B face (side face) and the (100) face (top face). It is known that increasing the width Wm of the $SiO_2$ stripe mask 2 leads to an increase in growth rate (layer thickness) due to the inflow of the source materials from the surface of the $SiO_2$ stripe mask 2 and, in addition, an increase in In content.

The utilization of these phenomena enables layer structures with different band gap wavelengths to be built in the plane of an identical substrate.

Figure 2:
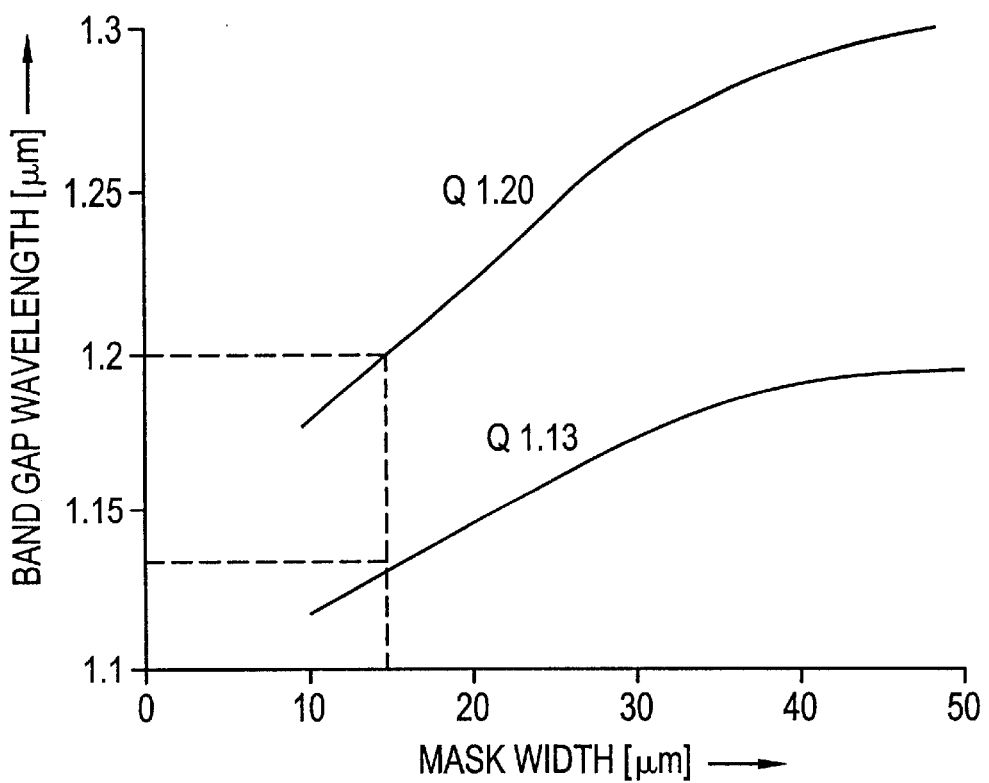
FIG. 2 is a characteristic diagram showing the relationship between the mask width and the band gap wavelength.

FIG. 2 shows the relationship between the mask width and the band gap wavelength. More specifically, FIG. 2 shows the relationship between the photoluminescence wavelength and the mask width in the case where an InGaAsP layer (band gap wavelengths 1.13 µm (Q 1.13) grid 1.20 µm (Q 1.20)), which is extensively used as a guide layer on the diffraction grating of a DFB laser with a 1.55 µm band, has been grown by selective MOVPE with a mask width of 15 µm so as to provide lattice matching with the InP substrate. As is apparent from FIG. 2, in the case of a band gap wavelength of 1.13 µm, increasing the mask width to 50 µm increases the photoluminescence wavelength to 1.20 µm. This is attributable to an increase in In content due to the increase in mask width.

Figure 3:
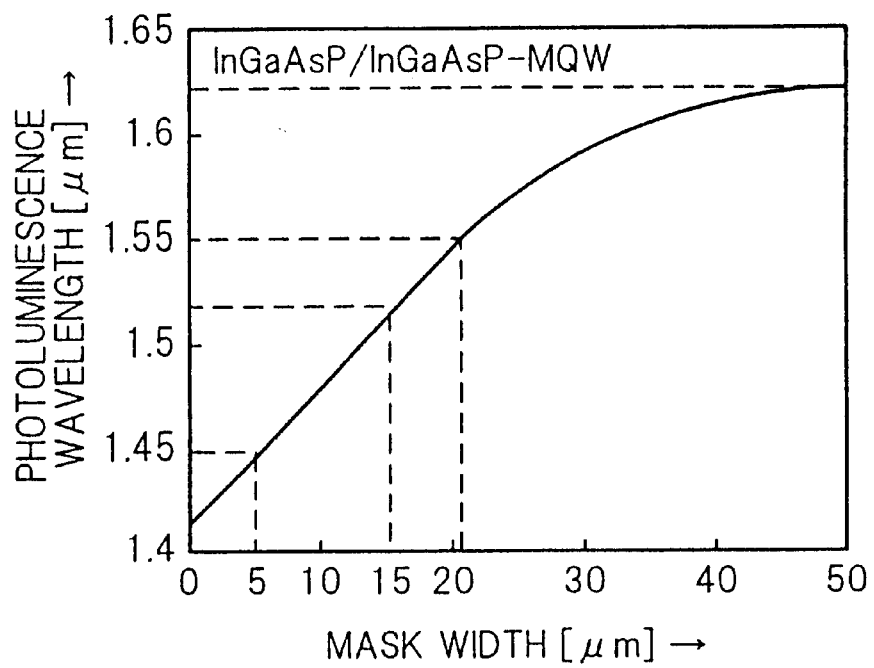
FIG. 3 is a characteristic diagram showing an example of the relationship between the photoluminescence wavelength and the mask width in the case where an InGaAsP/InGaAsP multiple quantum well (MQW) structure has been grown by selective MOVPE.

FIG. 3 shows an example of the relationship between the photoluminescence wavelength and the mask width in the case where an InGaAsP/InGaAsP multiple quantum well (MQW) structure has been grown by selective MOVPE. As is apparent from FIG. 3, increasing the mask width from 15 µm to 50 µm can cover a wavelength range of 1.52 to 1.62 µm. Further, the adoption of a mask width between 5 µm and 21 µm can cover a wavelength range of 1.45 to 1.55 µm. This can function as an operation wavelength of an electro-absorption (EA) modulator integrated in combination with the DFB laser having an oscillation wavelength in the range of 1.52 to 1.62 µm. A problem associated with this is a coupling coefficient κ for the oscillation wavelength. When DFB lasers with different wavelengths ranging from 1.52 to 1.62 µm are prepared in such a manner chat the mask width is varied in the range of 15 to 50 µm and InGaAsP, which has a mask width of 15 µm and a band gap wavelength of 1.13 µm, is used as the guide layer on the diffraction grating, as shown in FIG. 2, the band gap wavelength of the guide layer unfavorably changes from 1.13 µm to 1.20 µm. The change in band gap wavelength of the guide layer means that the refractive index of the guide layer changes. The presence of diffraction gratings leads to a change in coupling coefficient κ caused by a periodic change in refractive index.

Figure 4:
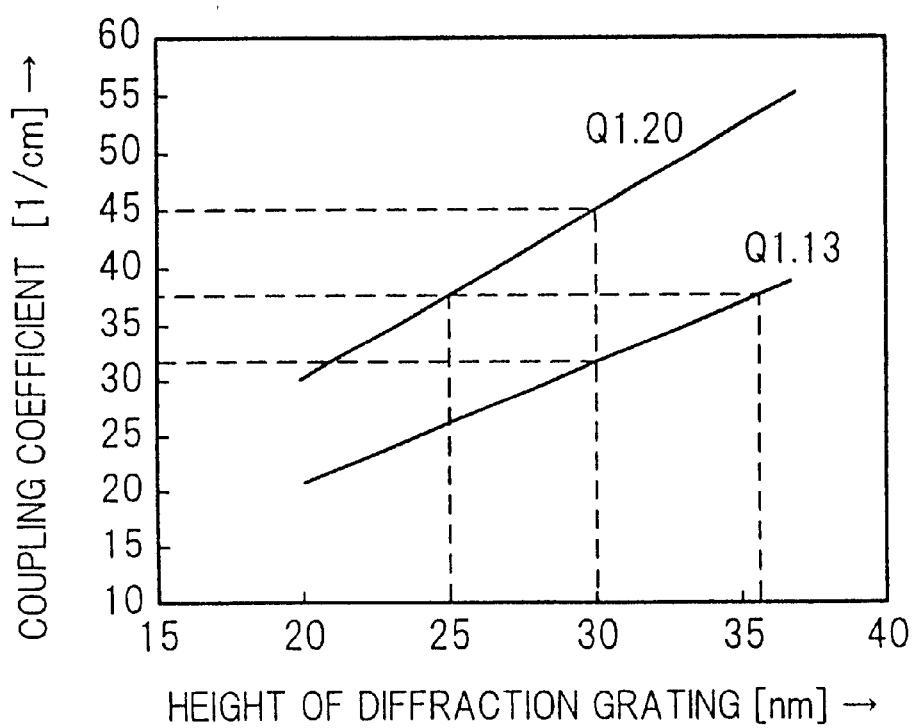
FIG. 4 is a characteristic diagram showing the results of calculation, using the composition of the guide layer as a parameter, of the relationship between the height of the diffraction grating, which is proportional to the level of a periodic change in refractive index of the guide layer, and the the coupling coefficient κ.

FIG. 4 shows the results of calculation, using the composition of the guide layer as a parameter of the relationship between the height of the diffraction grating, which is proportional to the level of a periodic change in refractive index of the guide layer, and the coupling coefficient κ.

When the band gap wavelength of the guide layer changes from 1.13 µm (Q 1.13) to 1.20 µm (Q 1.20), the coupling coefficient κ changes from 31 cm$^{-1}$ to 45 cm$^{-1}$ in the case of a diffraction grating height of 30 nm. Therefore, the coupling coefficient κ can be changed by changing the height of the diffraction grating. The invention has been made by drawing attention to this point. According to the invention, the height of the diffraction grating is varied according to the oscillation wavelength to prevent the periodic change in refractive index for the oscillation wavelength or the change in coupling coefficient κ due to a change in gain despite the fact that single longitudinal mode semiconductor lasers are different from each other in oscillation wavelength.

Figure 5:
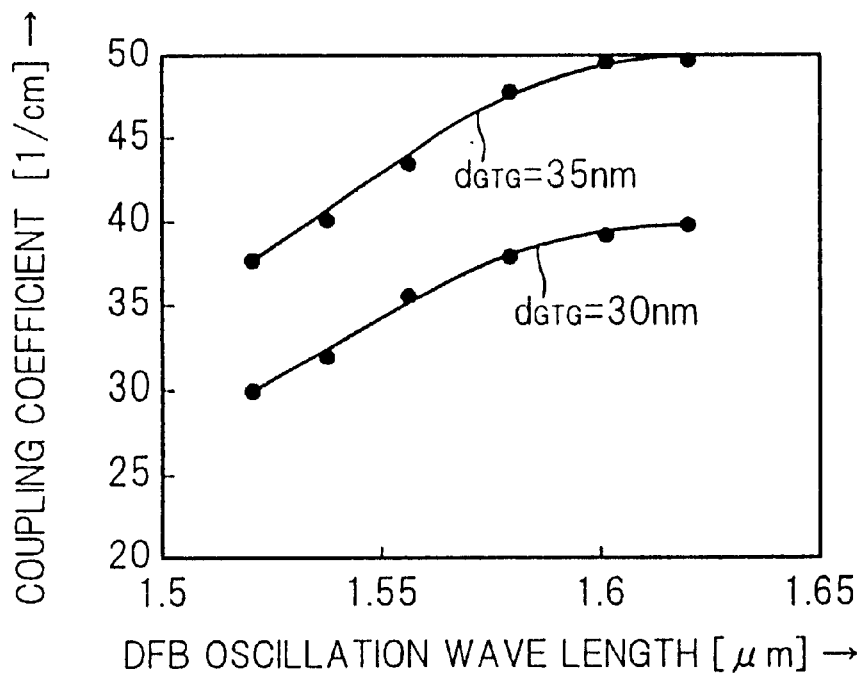
FIG. 5 is a characteristic diagram showing the relationship between the coupling coefficient κ and the DFB oscillation wavelength obtained by measurement in the case where a plurality of DFB lasers have been simultaneously formed on a substrate.

FIG. 5 shows the relationship between the coupling coefficient κ and the DFB oscillation wavelength obtained by measurement in the case where a plurality of DFB lasers have been simultaneously formed on a substrate.

In this case, the plurality of DFB lasers were operated at an oscillation wavelength of 1.52 to 1.62 µm. The measurement was carried out for two diffraction grating heights of 30 nm and 35 nm. As a result, it was found that the coupling coefficient κ is changed to 30 to 40 cm$^{-1}$ for the diffraction grating height of 30 nm, and to 38 to 50 cm$^{-1}$ for the diffraction grating height of 35 nm. In both the cases, the level of change is smaller than the calculated value shown in FIG. 4. The reason for this is that an increase in optical confinement factor in the laser active layer due to an increase in layer thickness by increasing the mask width has not been taken into account in the calculation shown in FIG. 4.

The change in coupling coefficient κ poses a problem that in addition to change in threshold of laser oscillation and luminous efficiency, the yield of longitudinal single mode oscillation and the characteristics of long-distance transmission are deteriorated. In particular, the characteristics of long-distance transmission are very important because they are a final evaluation item after the formation of devices. A fluctuation in wavelength (chirp) induced by reflection return light at the time of the modulating operation causes the influence of the coupling coefficient κ on the characteristics of long-distance transmission. Maximizing the coupling coefficient κ is preferred for increasing the resistance to reflection to suppress the wavelength chirp.

Figure 6:
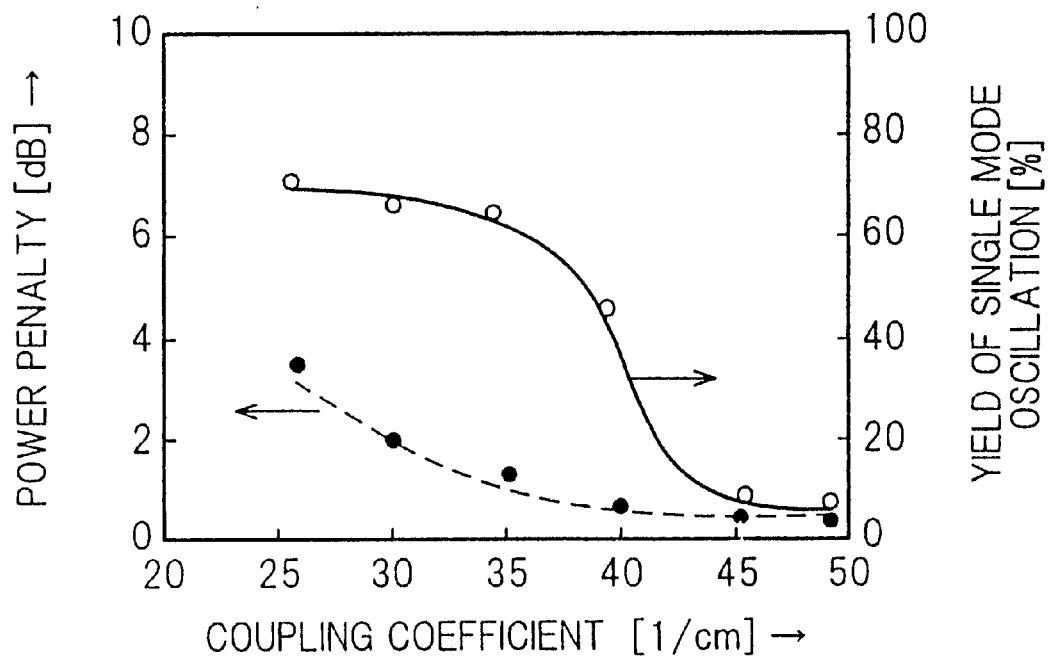
FIG. 6 is a characteristic diagram showing the relationship between the power penalty and the coupling coefficient κ after transmission under conditions of modulation 2.5 Gb/sec and distance 600 km (indicated by a dotted line) and the relationship between coupling coefficient κ and yield of longitudinal single mode oscillation (indicated by a solid line)

FIG. 6 shows the relationship between the power penalty after transmission under conditions of modulation 2.5 Gb/sec and distance 600 km (a difference between the optical received power before the transmission of data to an optical fiber and the optical received power after the transmission of data to an optical fiber by bit error rate evaluation) and the coupling coefficient κ (characteristics indicated by a dotted line with closed circles) and the relationship between the coupling coefficient κ and yield of longitudinal single mode oscillation (characteristics indicated by a solid line with open circles).

In this measurement, a monolithic integration product of an even diffraction grating DFB laser having a device length of 400 µm and an EA modulator having a length of 200 µm is used as the device. The power penalty after transmission by 600 km decreases with increasing the coupling coefficient κ, and a power penalty of not more than 1 dB is realized at κ>37 cm$^{-1}$. On the other hand, regarding the relationship between the coupling coefficient κ and the yield of longitudinal single mode oscillation, the larger the coupling coefficient κ, the lower the yield caused by the influence of spatial hole burning. This indicates that the regulation of the coupling coefficient κ in a certain range is very important.

Figure 7:
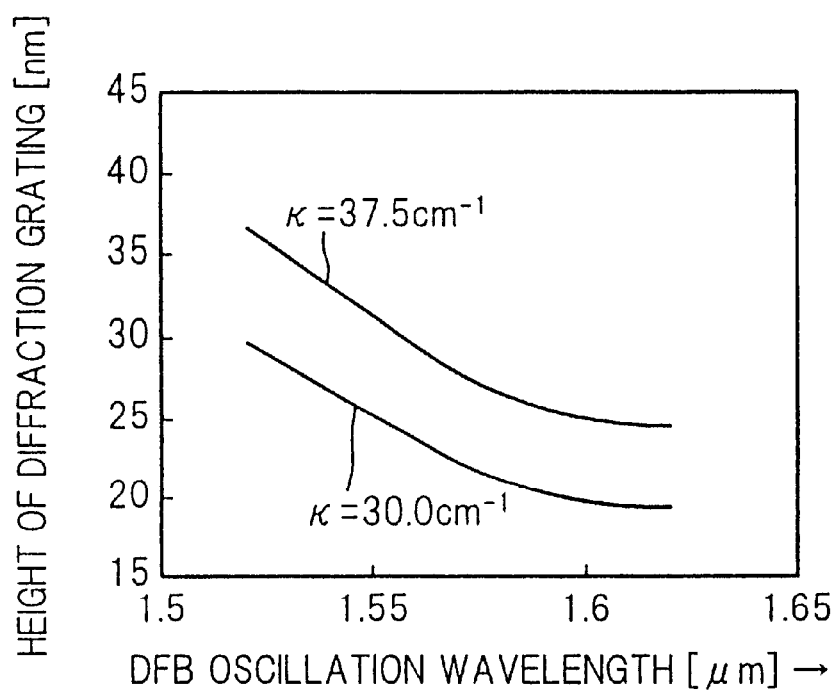
FIG. 7 is a characteristic diagram showing the relationship between the height of diffraction grating and the oscillation wavelength, for rendering the coupling coefficient κ identical in the case where there is no change in band gap wavelength of the guide layer.

FIG. 7 shows the relationship between the height of diffraction grating and the oscillation wavelength, for rendering the coupling coefficient κ identical in the case where there is no change in band gap wavelength of the guide layer.

As shown in FIG. 4, the coupling coefficient κ is proportional to the height of the diffraction grating. For this reason, based on the experimental results shown in FIG. 5, the relationship between the height of the diffraction grating and the DFB oscillation wavelength for providing an identical coupling coefficient κ=30 cm$^{-1}$ and an identical coupling coefficient κ =37.5 cm$^{-1}$ independently of the oscillation wavelength was determined.

Figure 8:
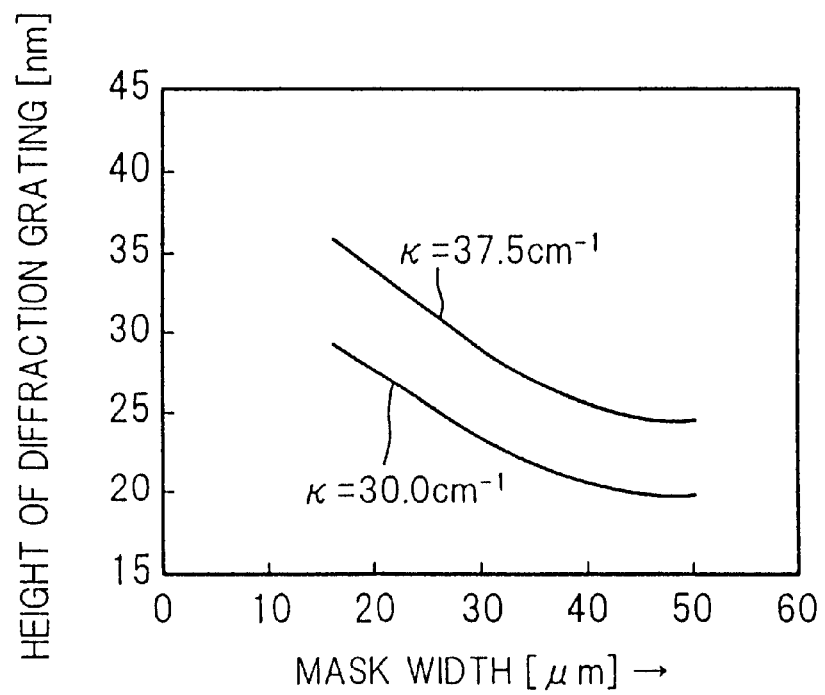
FIG. 8 is a characteristic diagram showing the relationship between the height of diffraction grating and the width of mask for selective growth in the case where the value of coupling coefficient κ has been made identical.

FIG. 8 shows the relationship between the height of diffraction grating and the width of mask for selective growth in the case where the value of coupling coefficient κ has been made identical. The coupling coefficient κ can be made identical by regulating the height of the diffraction grating or the mask width.

As is apparent from the foregoing description, the coupling coefficient κ can be kept at a constant value by setting the height of the diffraction grating at an optimal value according to the oscillation wavelength.

Next, a method for setting the height of the diffraction grating will be explained.

Figure 9:
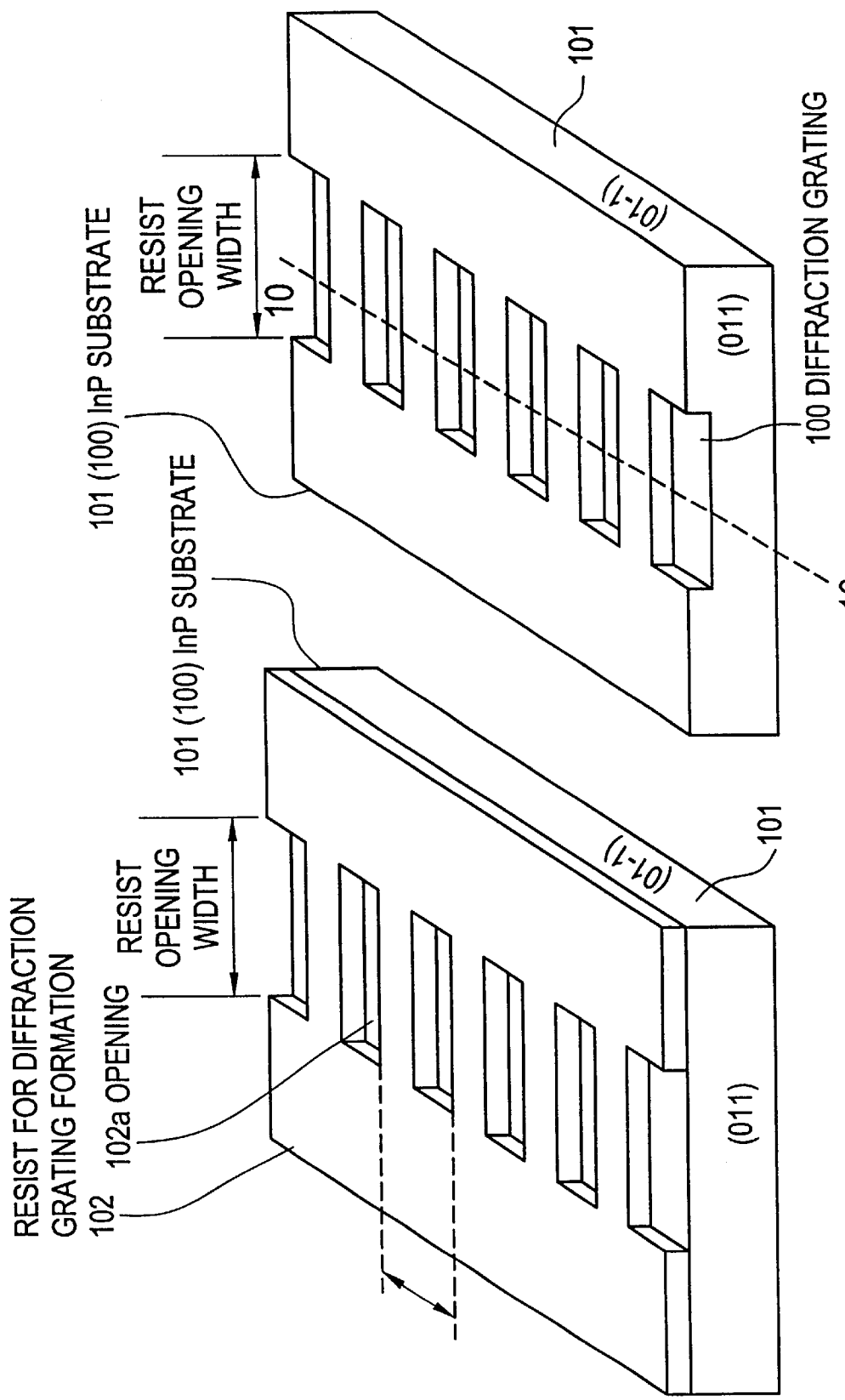
FIGS. 9A–9B is a perspective view showing diffraction gratings formed by electron beam exposure.
Figure 10:
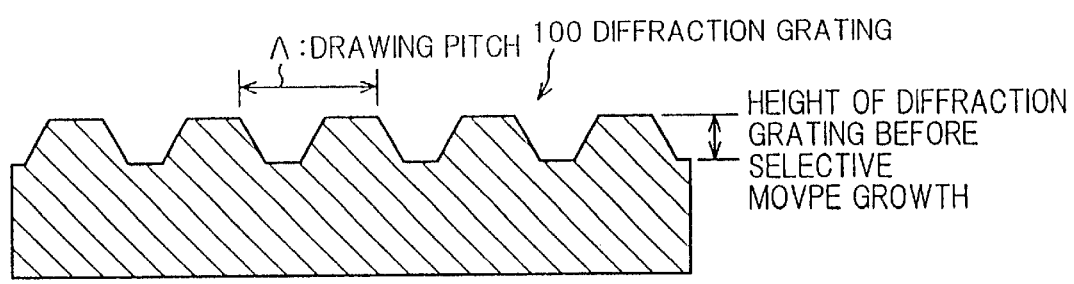
FIG. 10 is a cross-sectional view taken on line B–B' of FIG. 9.

FIG. 9 shows diffraction gratings formed by electron beam exposure. FIG. 10 is a cross-sectional view taken on line B–B' of FIG. 9.

As shown in FIG. 9A, patterning is first carried out by electron beam exposure using a resist 102 for diffraction grating formation on a substrate 101. Openings 102a are then etched by chemical etching with an HBr: $H_2O_2$ system solution, followed by the removal of the resist 102 to form diffraction gratings 100 as shown in FIG. 9B and FIG. 10. After the etching, quasi-mesa is formed on the substrate, and trapezoidal concaves and convexes are transferred as diffraction gratings 100 onto the substrate 101. In this case, the height of the diffraction grating 100 defined by the distance from the peak to the valley of the diffraction grating 100 (the height of the diffraction grating before selective MOVPE growth) will be hereinafter referred to as $d_{GTG1}$, and the height defined as the distance from the peak to the valley after selective MOVPE on the diffraction grating 100 (the height of the diffraction grating after selective MOVPE growth) will be hereinafter referred to as $d_{GTG2}$. When the opening width of the resist for patterning by electron beam exposure is $W_E$, the height $d_{GTG1}$ can be varied by varying the resist opening width $W_E$.

Figure 11:
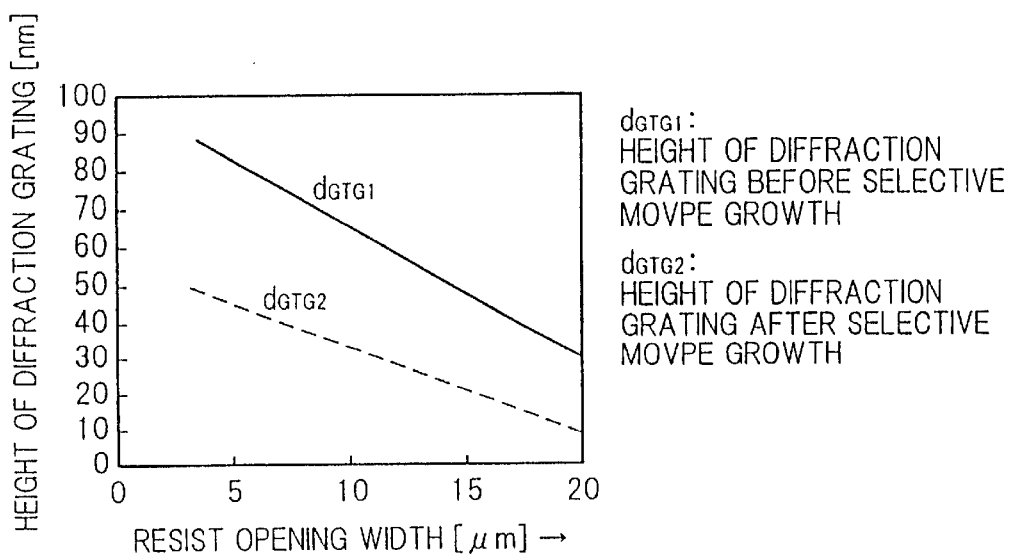
FIG. 11 is a characteristic diagram showing the relationship between the opening width $W_Z$ and the height $d_{GTG1}$.

FIG. 11 shows the relationship between the opening width $W_E$ and the height $d_{GTG1}$.

The wider the opening width $W_E$, the lower the height $d_{GTG1}$ defined as the distance from the peak to the valley of the diffraction grating 100. The reason for this is as follows. The etching area increases with increasing the opening width $W_E$, and, when etching is carried out with an $HBr:H_2O_2$ system solution which provides a given etching level per unit time, the etching depth is reduced. The utilization of this phenomenon enables the regulation of the height of the diffraction grating 100 by the resist opening width $W_E$. When the device is actually produced, the diffraction grating height $d_{GTG1}$ after selective MOVPE growth is important rather than $d_{GTG1}$. For this reason, FIG. 11 also shows the relationship between the resist opening width $W_E$ and the diffraction grating height $d_{GTG1}$ which have been experimentally determined. As is apparent from FIG. 11, $d_{GTG2}$ can be regulated in the range of 10 to 50 nm.

[First Preferred Embodiment]

Next, the production process of an optical semiconductor device according to the invention will be explained in conjunction with the accompanying drawings.

Figure 12:
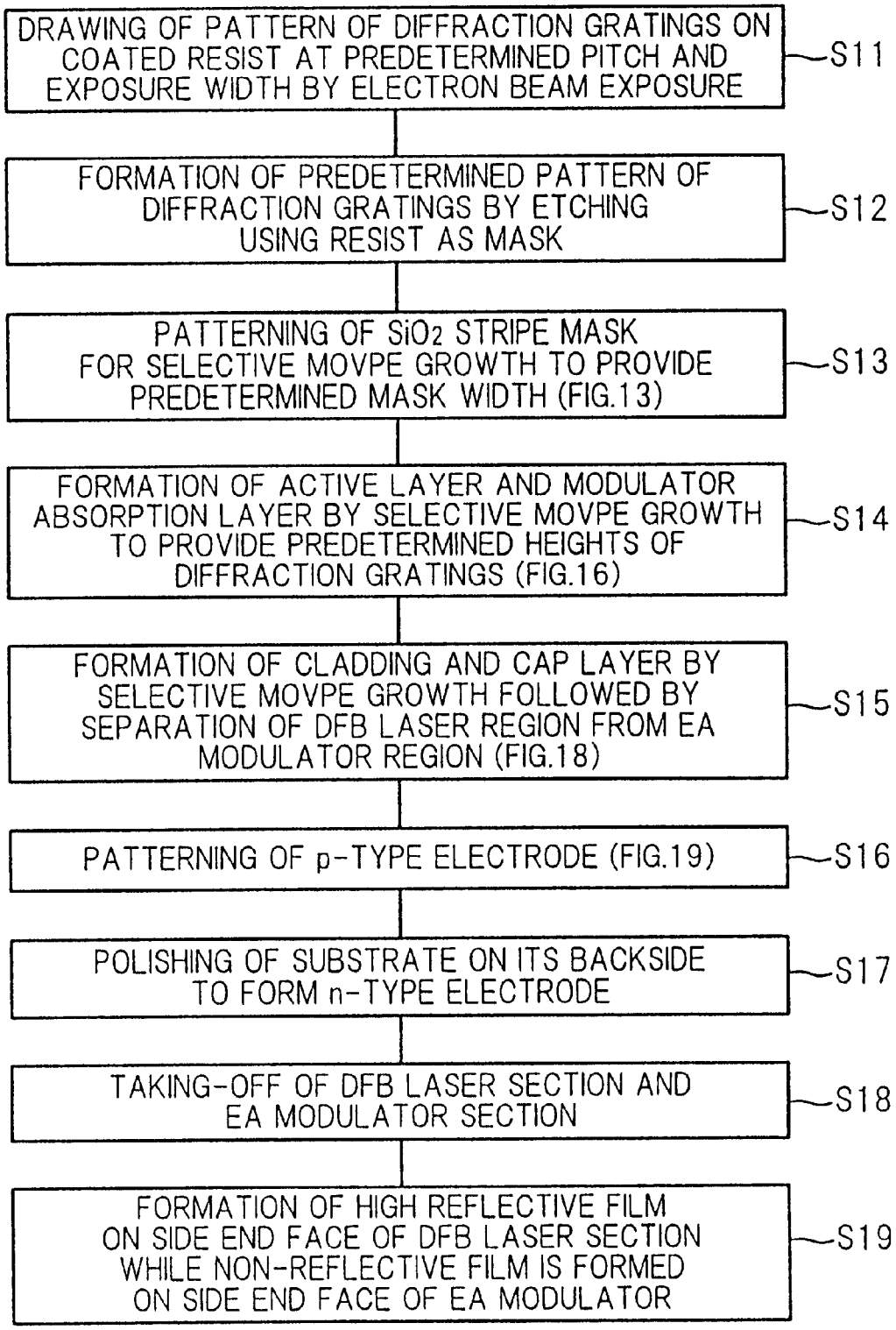
FIG. 12 is a flow chart showing the production process of an optical semiconductor device according to the invention.
Figure 13:
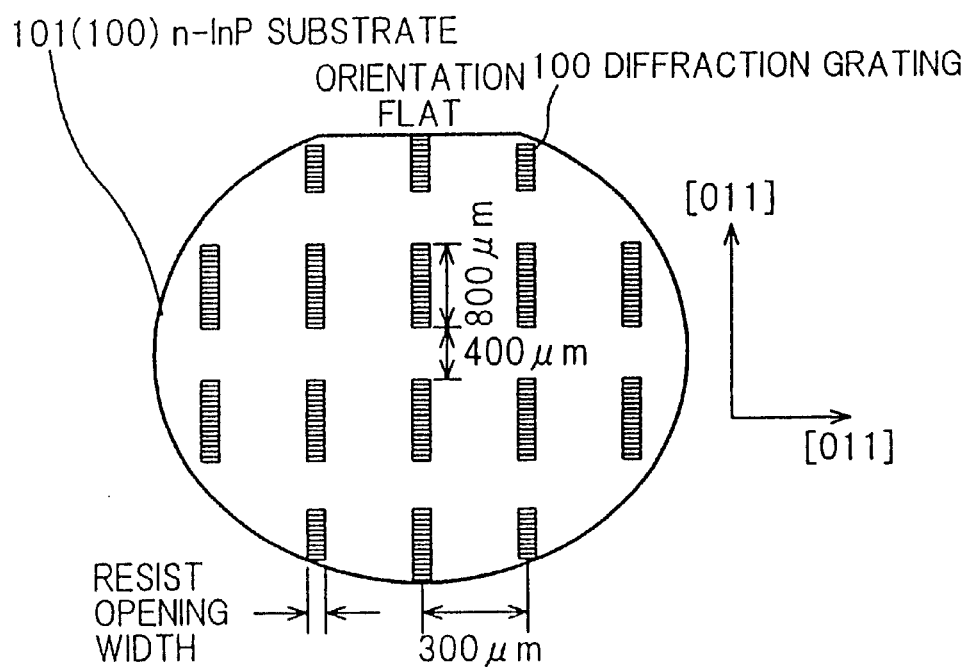
FIG. 13 is a plan view illustrating the formation of a plurality of diffraction gratings on a substrate.
Figure 14:
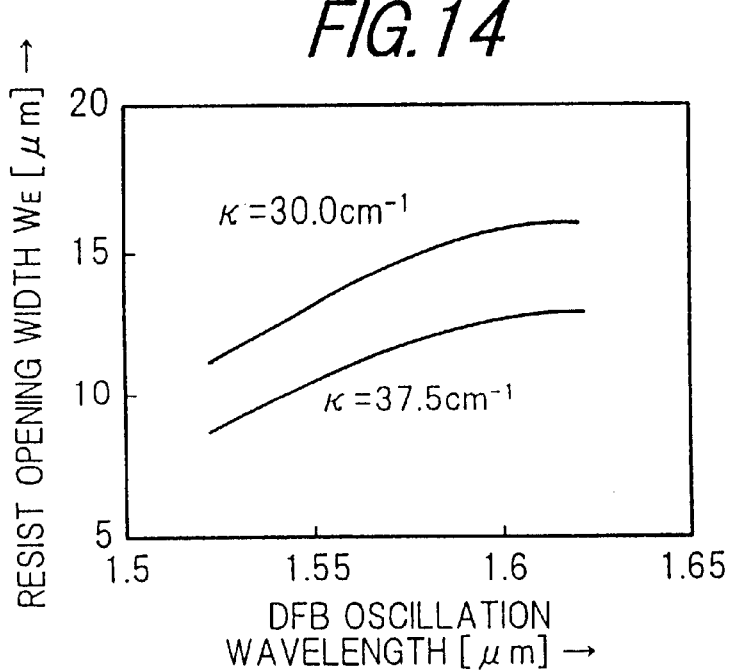
FIG. 14 is a characteristic diagram showing the relationship between the resist opening width $W_E$ and DFB oscillation wavelength.
Figure 15:
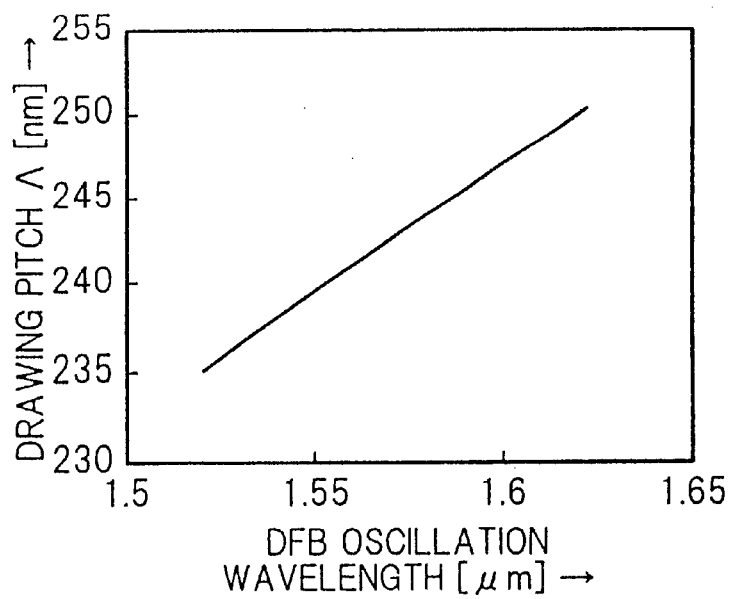
FIG. 15 is a characteristic diagram showing the relationship between the drawing pitch and the DFB oscillation wavelength.
Figure 16:
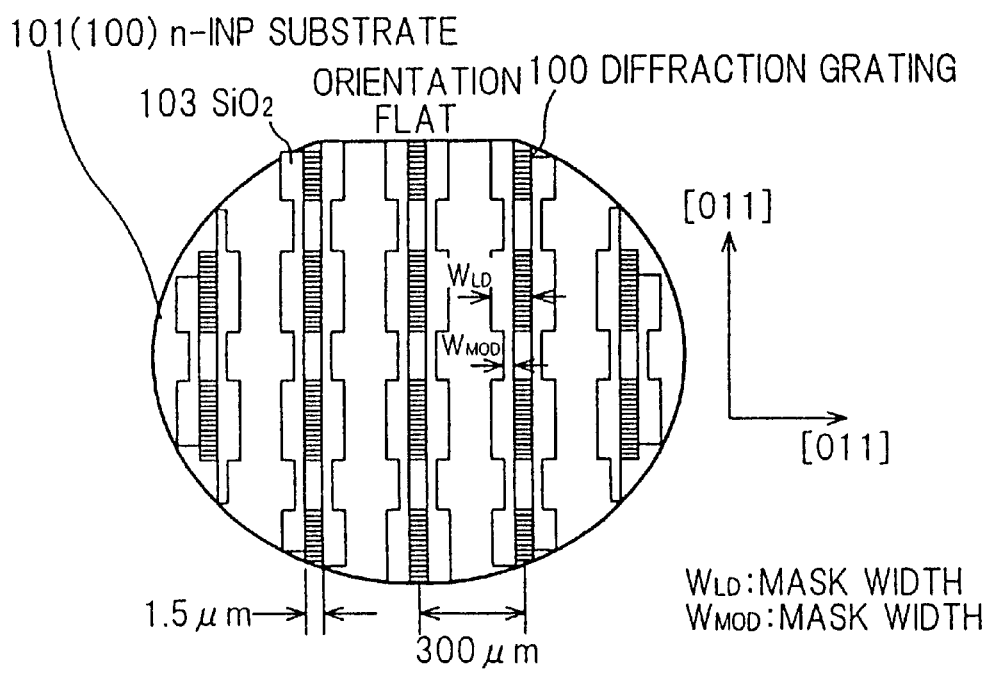
FIG. 16 is a plan view showing $SiO_2$ stripe masks patterned according to diffraction gratings.
Figure 17:
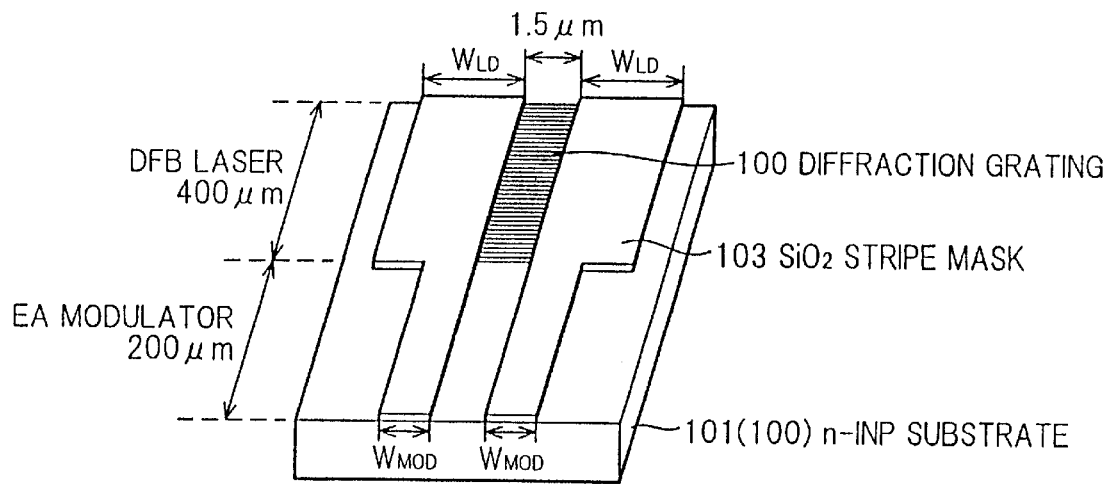
FIG. 17 is a partially enlarged view showing the details of the $SiO_2$ stripe mask and one device shown in FIG. 16.
Figure 18:
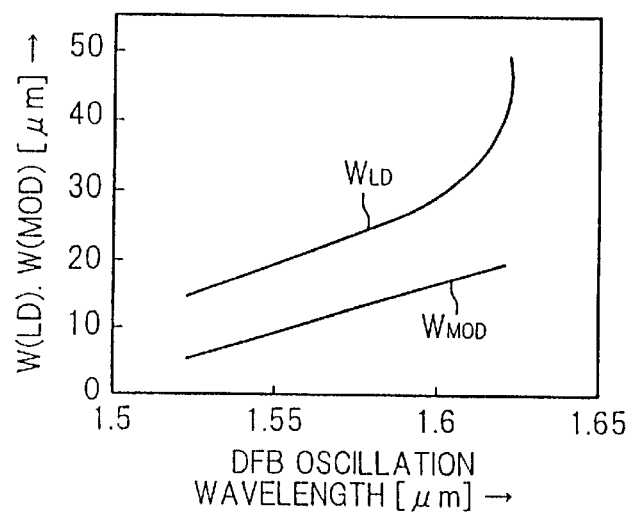
FIG. 18 is a characteristic diagram showing design values of the mask width $W_{LD}$ of a diffraction grating formed region and the mask width $W_{MOD}$ of a region where diffraction gratings have not been formed, in relation with the DFB oscillation wavelength.
Figure 19:
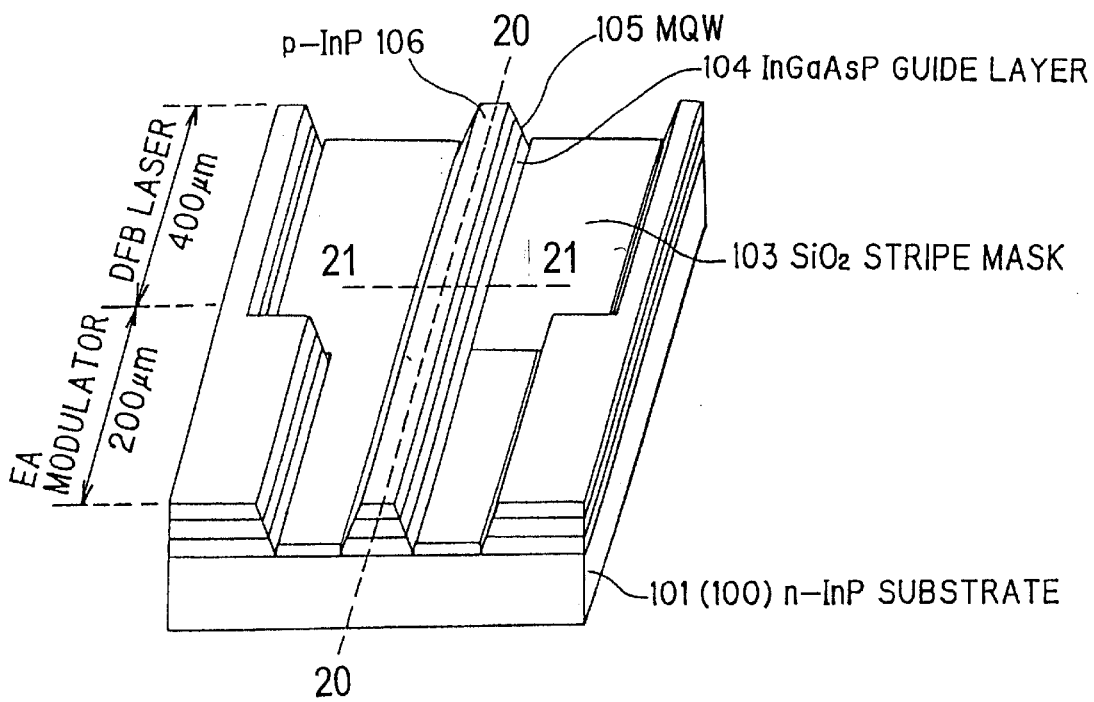
FIG. 19 is a perspective view illustrating the formation of a laser active layer and a modulator absorption layer by selective MOVPE.
Figure 20:
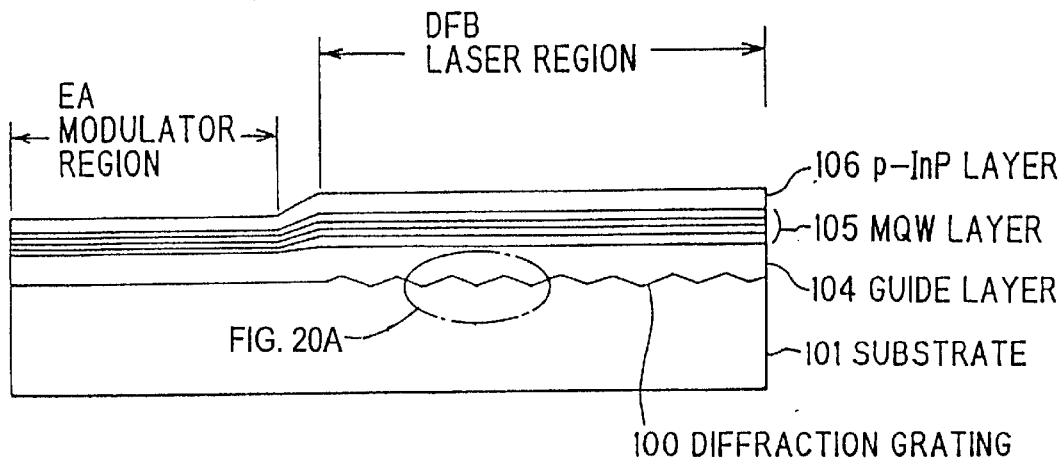
FIG. 20–20A is a cross-sectional view taken on line A–A' of FIG. 19.
Figure 20A:
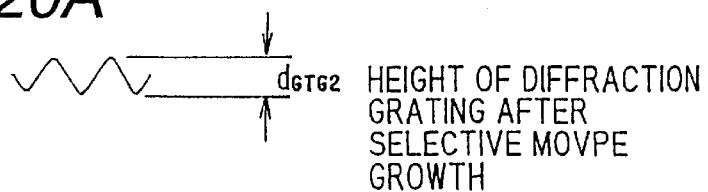
Figure 21A:
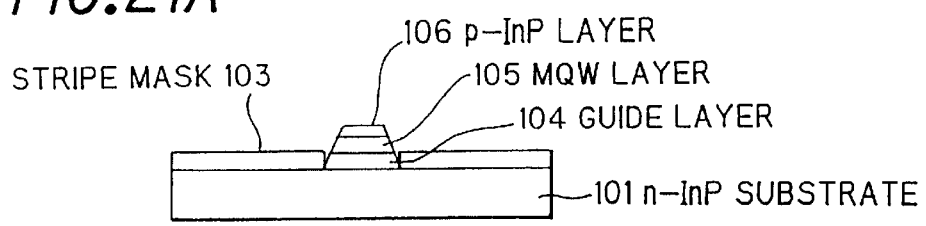
FIGS. 21A–21C is a diagram illustrating the production process, taken on line C–C' of FIG. 19.
Figure 21B:
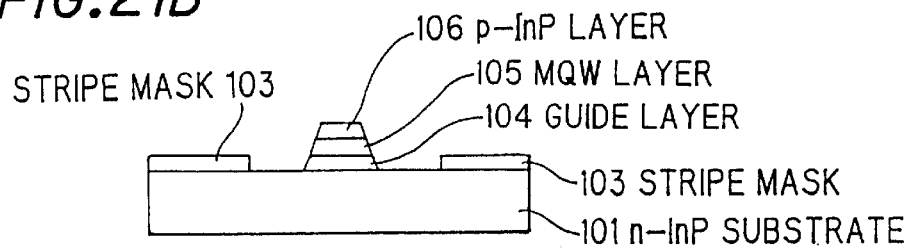
Figure 21C:
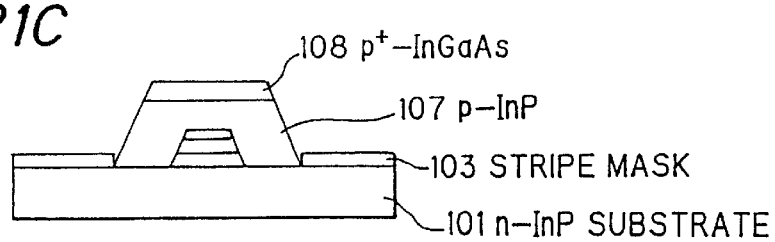
Figure 22:
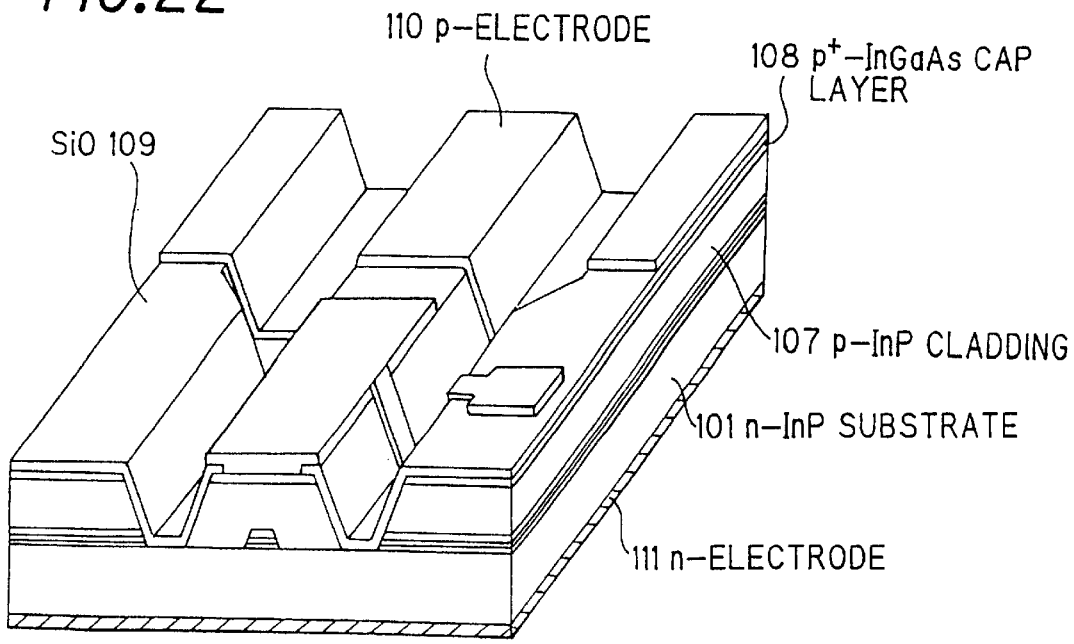
FIG. 22 is a perspective view illustrating pattering of a p-type electrode (a P electrode)

FIGS. 12, 13, 14, 15, 16, 17, 10, 19, 20, 21, and 22 show the first preferred embodiment of the invention. The first preferred embodiment is an example of an integration product of DFB lasers and, EA modulators with different wavelengths. FIG. 12 shows a production process of an optical semiconductor device according to the invention, FIG. 13 is illustrates the formation of a plurality of diffraction gratings on a substrate, wherein OF represents an orientation flat (this is true of FIG. 16), FIG. 14 shows the relationship between the resist opening width $W_E$ and the DFB oscillation wavelength. FIG. 15 shows the relationship between the drawing pitch and the DFB oscillation wavelength, FIG. 16 shows $SiO_2$ stripe masks patterned according to diffraction gratings, FIG. 17 shows the details of the $SiO_2$ stripe mask and one device shown in FIG. 16, FIG. 18 shows design values of the mask width $W_{LD}$ of a diffraction grating formed region and the mask width $W_{MOD}$ of a region where diffraction gratings have not been formed, in relation with the DFB oscillation wavelength, FIG. 19 illustrates the formation of a laser active layer and a modulator absorption layer by selective MOVPE, FIG. 20 is a cross-sectional view taken on line A–A' of FIG. 19, FIG. 21 a cross-sectional view taken on line C–C' of FIG. 19, and FIG. 22 illustrates pattering of a p-type electrode (a P electrode).

The production process according to the first preferred embodiment of the invention will be explained with reference to FIGS. 12 to 22. A electron beam-sensitive positive-working resist 102 is first coated on a (100)n-InP substrate 101. A pattern as shown in FIG. 9A is then drawn by electron beam exposure (step S11). Thereafter, the n-InP substrate 101 is etched with an $HBr:H_2O_2$ etching solution using the resist 102 as a mask to form diffraction gratings 100 with an opening 102a as shown in FIG. 9B (step S12).

In this case, a pattern composed of an 800 μm-long diffraction grating formed region and a 400 μm-long diffraction grating non-formed region repeated in the direction of (011) of the n-InP substrate 101 (FIG. 13). In the direction of [01-1], the pattern constituted by the repetition at spacings of 300 μm was provided. As shown in FIG. 14, the electron beam exposure width (=resist opening width $W_E$) for the simultaneous formation of a plurality of diffraction gratings 100 was brought to 8.5 to 13.0 μm (κ=37.5 $cm^{-1}$) to control the height of the diffraction gratings 100. Specifically, the resist opening width $W_E$ corresponding to the DFB oscillation wavelength is set so as to give κ=37.5 $cm^{-1}$. Further, as shown in FIG. 15, the drawing pitch Λ is set in the range of 235.05 to 250.85 nm for each diffraction grating 100 according to the desired oscillation wavelength.

Next, as shown in FIG. 16, a pair of $SiO_2$ stripe flasks 103 for selective MOVPE growth are patterned so as to conform to the diffraction gratings 100 (step S13). In this case, in the diffraction grating 100 formed region, the mask width was set to $W_{LD}$, while, in the diffraction grating 100 non-formed region, the mask width was set to $W_{MOD}$. The details of the patterning are shown in FIG. 14. Specifically, the region with a mask width $W_{LD}$ (length 400 μm) corresponds to a DFB laser, and the region with a mask width $W_{MOD}$ (length 200 μm) corresponds to an EA modulator. The spacing between the pair of strike masks was fixed to 1.5 μm. The design values of the mask widths $W_{LD}$ and $W_{MOD}$ in relation with the DFB oscillation wavelength are as shown in FIG. 15.

In FIGS. 14, 15, and 18, the resist opening widths $W_E$. A. $W_{LD}$, and $W_{MOD}$ are continuously described in relation with the DFB oscillation wavelength. In this case, however, for the DFB oscillation wavelengths ranging from 1.52 to 1.62 μm, 125 wavelengths are adopted at spacings of 100 GHz (approximately 0.8 nm). Therefore, in fact, in graphs shown in FIGS. 14, 15, and 18, 125 stepped discontinuous values are adopted.

Next, as shown in FIG. 19, the laser active layer (a back portion in FIG. 19) and the absorption layer of the modulator (a front portion in FIG. 19) are grown by selective MOVPE) (step S14). In this case, $W_{LD}$ was brought to 15 μm and, as shown in FIG. 20, an n-InGaAsP guide layer 104 (band gap wavelength 1.13 μm, layer thickness 150 nm, $n=1\times10^{18}$ $cm^{-3}$), a strain MQW layer 105 consisted of 8 pairs of InGaAsP well layers (strain, +0.60%, thickness 10 nm) and InGaAsP barrier layers (band gap wavelength 1.20 μm and thickness 9 nm), and a p-InP layer (thickness 150 nm, $p=5\times10^{17}$ $cm^{-3}$) 106 covering the layer 105 were formed. In the DFB laser region shown in FIG. 19, the diffraction grating 100 is stored after selective MOVPE growth. As can be seen from FIGS. 11 and 14, the height of the diffraction grating $d_{GTG2}$ is varied in the range of 25 to 36 nm for the oscillation wavelengths 1.52 to 1.62 μm. That is, as can be seen from FIG. 14, in the case of κ=37.5 $cm^{-1}$, the opening width $W_E$ for the oscillation wavelengths 1.52 to 1.62 μm is determined to be 8.5 to 13 μm. When this value is applied to FIG. 11, $d_{GTG2}$ is 25 to 36 μm. Thus, when $d_{GTG2}$ is regulated according to the oscillation wavelength, the coupling coefficient κcan be made identical (κ=37.5 $cm^{-1}$) independently of the oscillation wavelength.

Next, a part of $SiO_2$ on both sides of the selective growth layer is removed (FIG. 21B) from the state shown in FIG. 21A (a cross-sectional view taken on line C–C' of FIG. 19). As shown in FIG. 21C, a p-InP cladding 107 (thickness 1.5 $\mu$m, p=1×10$^{18}$ cm$^{-3}$) and a p$^-$=InGaAs cap layer 108 (thickness 0.25 $\mu$m p=6×10$^{18}$ cm$^{-3}$) are then grown by selective MOVPE, followed by the removal of the 30-$\mu$m p$^-$-InGaAs cap layer 108 between the DFB laser region and EA modulator region to perform electrical separation (step S15). As shown in FIG. 22, a p-type electrode (p electrode) 110 is patterned using the $SiO_2$ layer 109 as the interlayer film (step S16). Further, the backside is polished until the thickness of the n-InP substrate 101 reaches 120 $\mu$m, followed by the formation of an n-type electrode (n electrode) 111 (step S17). Finally, a DFB laser section having a length of 400 $\mu$m and an EA modulator section having a length of 200 $\mu$m (total length 600 $\mu$m) are taken off from the position shown in FIG. 19 (step S18). Further, a high reflective layer having a reflectance of 95% is coated on the side end facet of the DFB laser, while an antireflection layer having a reflectance of not more than 0.1% is coated on the side end facet of the modulator (step S19). The optical semiconductor device thus obtained was evaluated for the following characteristics.

The results of evaluation of the optical semiconductor device according to the first preferred embodiment of the invention will be explained.

Figure 23:
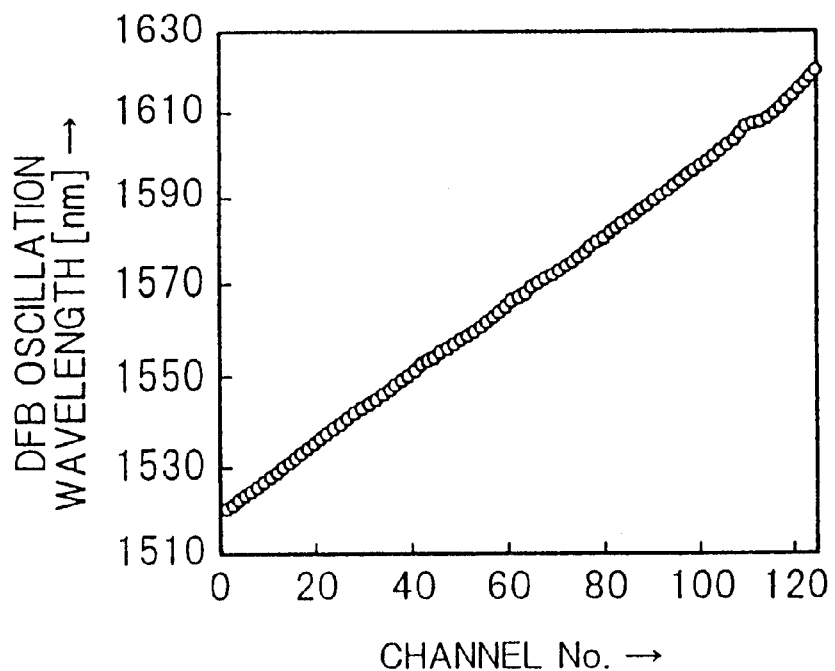
FIG. 23 is a characteristic diagram showing the results of measurement of the oscillation wavelength of a DFB laser of 125 devices (125 channels)

FIG. 23 shows the results of measurement of the oscillation wavelength of a DFB laser of 125 devices. (125 channels).

In this drawing, oscillation wavelength characteristics of the optical semiconductor device comprising EA modulators and DFB lasers with different wavelengths which have been integrated with each other as described above, are shown. It can be confirmed that, from channel 1 to channel 125, the wavelength is increased at a slope of 0.8 nm/channel as substantially designed and that devices with different wavelengths covering a wavelength range of 1,520 to 1,620 nm (1.52 to 1.62 $\mu$m) is realized on a single substrate.

Figure 24:
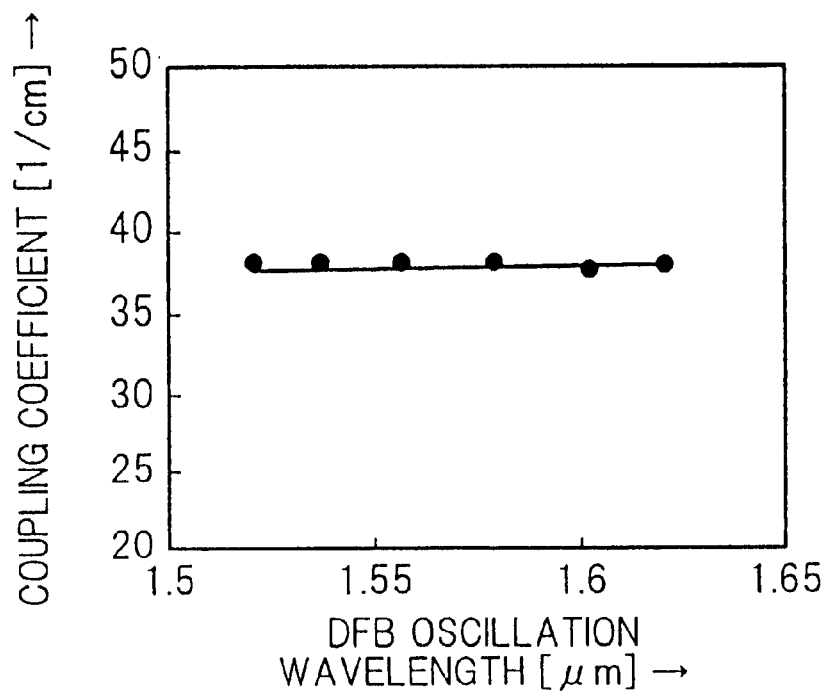
FIG. 24 is a characteristic diagram showing the results of measurement of the coupling coefficient κ as a function of different DFB oscillation wavelengths.

FIG. 24 shows the results of measurement of the coupling coefficient κ as a function of different DFB oscillation wavelengths. As is apparent from FIG. 24, the coupling coefficient κ does not depend upon the DFB oscillation wavelength, and is substantially maintained at a value of 37.5 cm$^{-1}$ as designed. Thus, unlike the prior art technique wherein the coupling coefficient κ varies depending upon the DFB oscillation wavelength, according to the invention, the change in the coupling coefficient κ could have been prevented by varying the height of the diffraction gratings according to the DFB oscillation wavelength.

Figure 25:
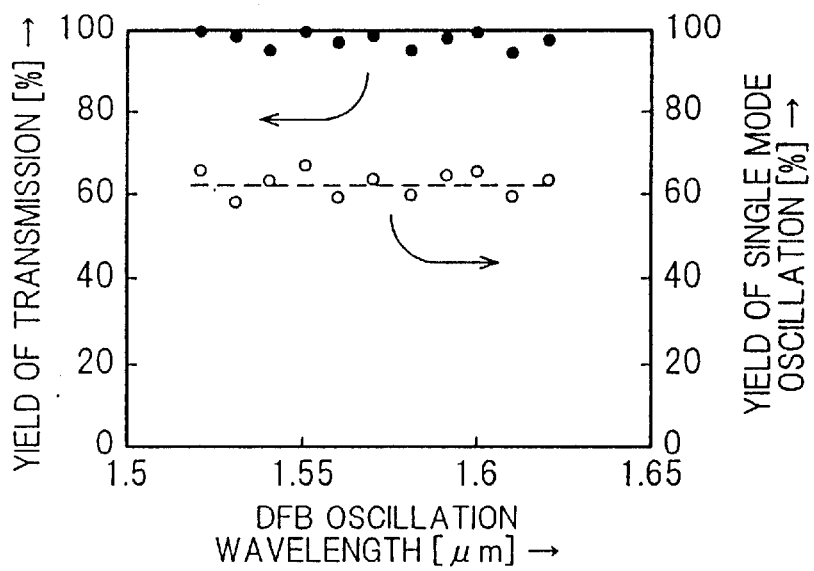
FIG. 25 is a characteristic diagram showing the yield of transmission and the yield of single longitudinal mode oscillation as a function of the DFB oscillation wavelength.

FIG. 25 shows the results of measurement of the yield of transmission and the yield of single longitudinal mode oscillation as a function of the DFB oscillation wavelength. As shown in FIG. 25, the yield of single longitudinal mode oscillation (characteristics indicated by a dotted line) also does not depend upon the DFB oscillation wavelength, and is maintained at a value of not less than 60%. Further, the yield of transmission determined according to a standard, wherein the power penalty after transmission under conditions of 2.5 Gb/sec and 600 km is not more than 1 dB (characteristics indicated by closed circles) was also good and was not less than 95% for all the DFB oscillation wavelengths.

[Second Preferred Embodiment]

A production process, wherein only DFB lasers with different wavelengths and free from EA modulators with different wavelengths are simultaneously formed on a substrate, will be explained as the second preferred embodiment of the invention with reference to FIGS. 26, 27, 28, 29, and 30.

Figure 26:
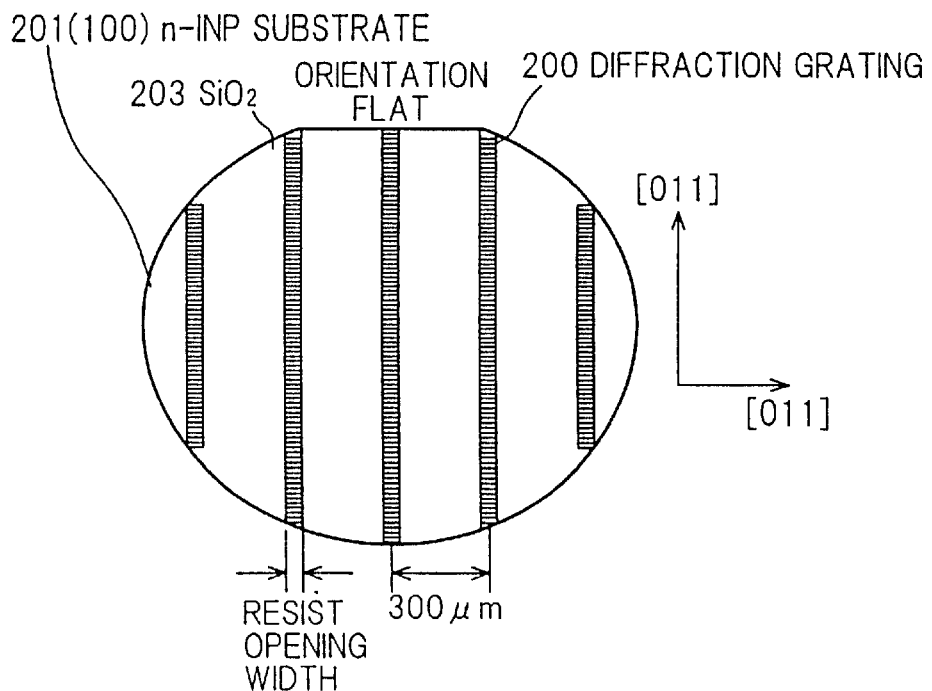
FIG. 26 is a plan view illustrating the formation of diffraction gratings according to the second preferred embodiment of the invention.
Figure 27:
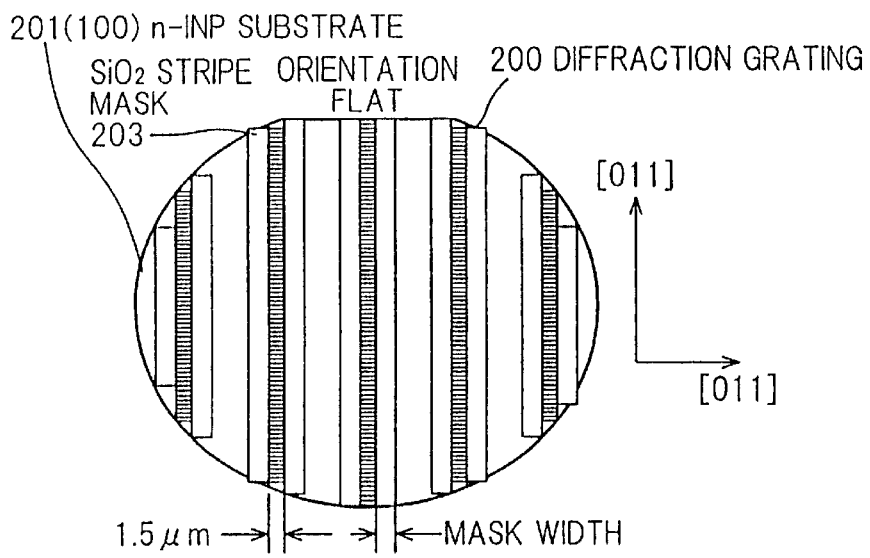
FIG. 27 is a plan view illustrating patterning using stripe masks after the step shown in FIG. 26.
Figure 28:
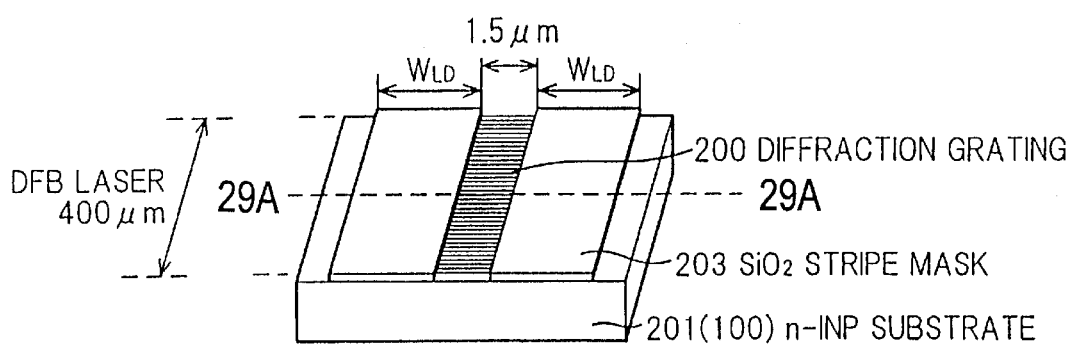
FIG. 28 is a partially enlarged view showing the arrangement of a mask pattern in one device.
Figure 29A:
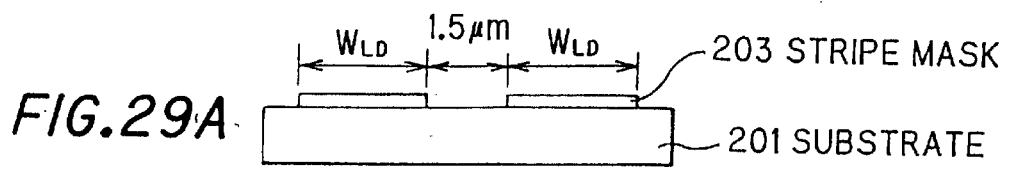
FIGS. 29A–29E is a cross-sectional view taken on line D–D' of FIG. 28.
Figure 29B:
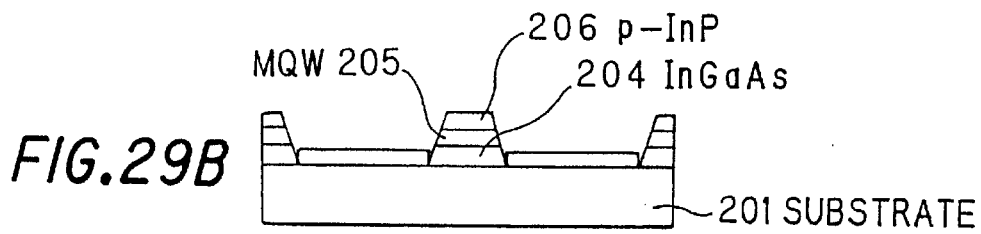
Figure 29C:
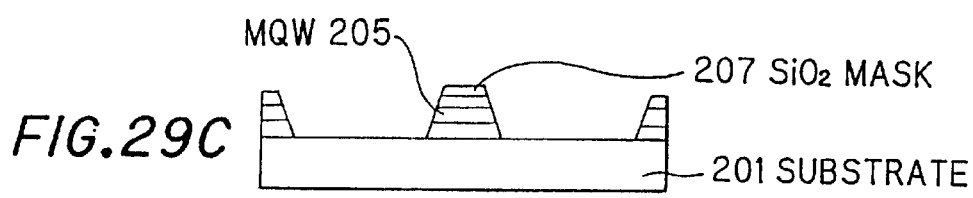
Figure 29D:
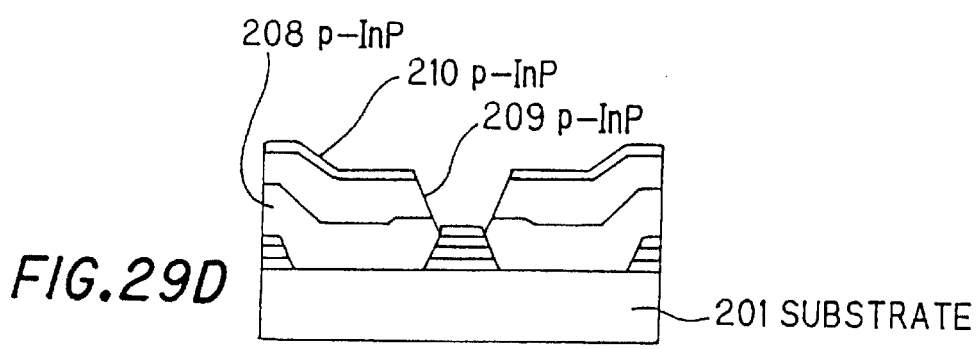
Figure 29E:
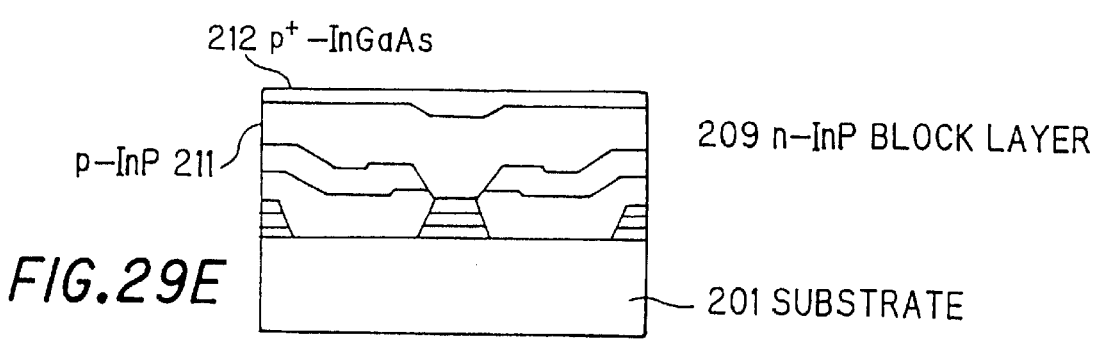
Figure 30:
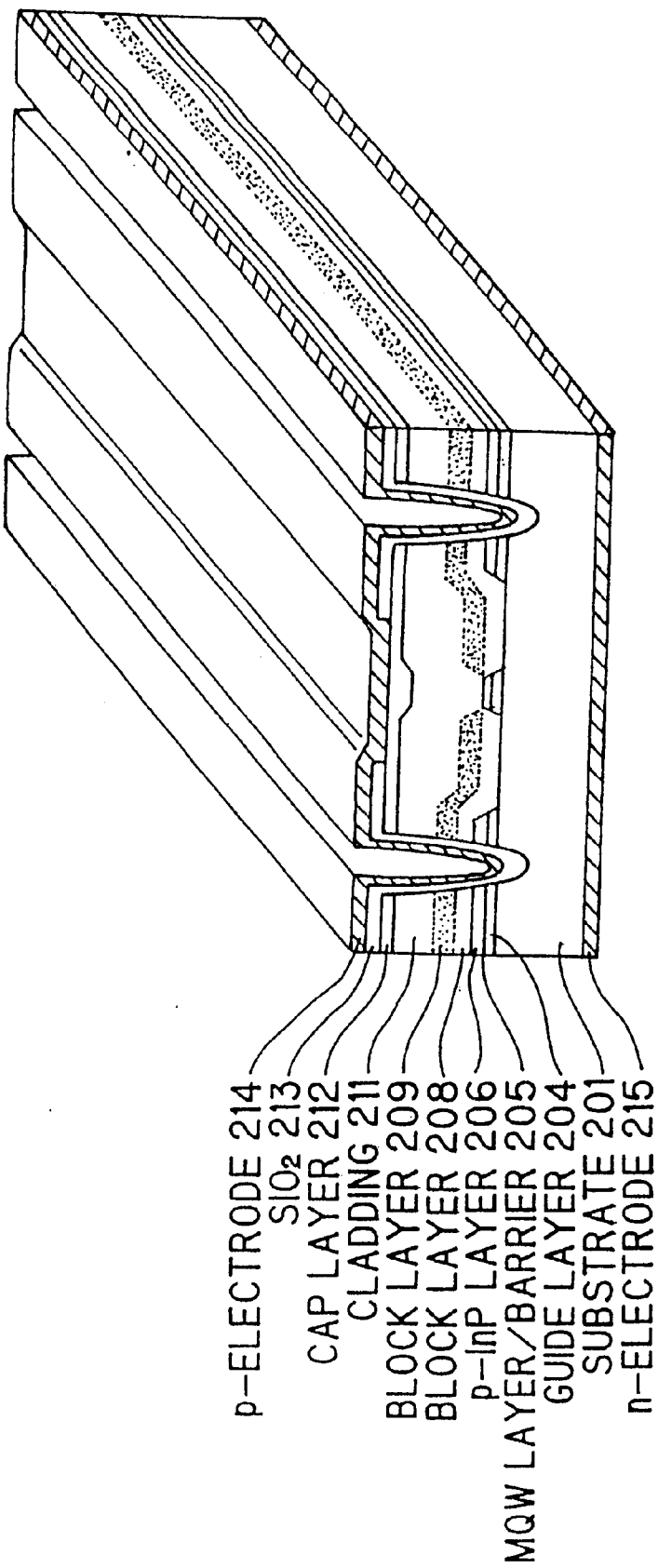
FIG. 30 is a perspective view illustrating the patterning of a p electrode.

FIG. 26 illustrates the formation of diffraction gratings, FIG. 27 illustrates patterning using stripe masks after the state shown in FIG. 26, FIG. 28 shows the arrangement of a mask pattern in one device, FIG. 29 is a cross-sectional view taken on line D–D' of FIG. 28, and FIG. 30 illustrates the patterning of a p electrode.

According to this preferred embodiment, as with the first preferred embodiment, diffraction gratings are formed by electron beam exposure and etching. At that time, as shown in FIG. 26, a plurality of diffraction gratings 200 are formed in all the regions in the direction of [011] of the substrate 201, and a pattern of diffraction gratings repeated at pitches of 300 $\mu$m is provided in the direction [01-1]. In this case, the electron beam exposure width (resist opening width $W_E$) at the time of formation of the diffraction gratings 200 is selected from a corresponding value in $W_E$ 11.0 to 16.0 $\mu$m as shown in a curve for the coupling coefficient κ=30 cm$^{-1}$ shown in FIG. 14. This enables the diffraction grating height to be set for each DFB oscillation wavelength so that the coupling coefficient κ is 30 cm$^{-1}$. The drawing pitch Λ is selected in the range of from 235.05 to 250.85 nm according to each DFB oscillation wavelength (FIG. 15). Next, as shown in FIG. 27, a pair of $SiO_2$ stripe masks 203 for selective MOVPE growth are patterned on the diffraction gratings 200. In this case, $W_{LD}$ represents mask width. FIG. 28 shows the arrangement of the $SiO_2$ stripe masks 203 in one device. The spacing between the pair of stripe masks was fined at 1.5 $\mu$m, and the designed $W_{LD}$ value for the DFB oscillation wavelength was the same as used in the first preferred embodiment.

In FIGS. 14, 15, and 16, the resist opening widths $W_E$, the drawing pitch Λ, and the mask width $W_{LD}$ are continuously described in relation with the DFB oscillation wavelength. In this preferred embodiment, however, for the DFB oscillation wavelengths ranging from 1.52 to 1.62 $\mu$m, 125 wavelengths are adopted at spacings of 100 GHz (approximately 0.8 nm). Therefore, in fact, in graphs shown in FIGS. 14, 15, and 18, 125 stepped discontinuous values are adopted.

Next, the step of selective MOVPE corresponding to step S13 in FIG. 12 will be explained in conjunction with FIG. 29. At the outset, as shown in FIG. 29B, an n-InGaAsP guide layer 204 (Band gap wavelength 1.13 $\mu$m, layer thickness 150 nm, n=1×10$^{18}$ cm$^{-3}$), a strain MQW layer 205 consisted of 5 pairs of InGaAsP well layers (strain +0.60%, thickness 10 nm) and InGaAsP barrier layers (band gap wavelength 1.20 $\mu$m and thickness 9 nm), and a p-InP layer (thickness 150 nm, p=5×10$^{17}$ cm$^{-3}$) 206 were grown by selective MOM (all the above values being those at $W_{LD}$=15 $\mu$m). As can be seen from FIG. 11 and FIG. 14, the height $d_{GTG2}$ of the diffraction grating stored after the selective MOVPE growth varies in the range of 20 to 30 nm according to the DFB oscillation wavelength. This can realize a constant coupling coefficient κ=30 cm$^{-1}$ independently of the DFB oscillation wavelength.

Next, as shown in FIG. 29C, an $SiO_2$ mask 207 is self-alignment formed on the selectively grown layer. Thereafter, as shown in FIG. 29D, a p-InP block layer 208, an n-InP block layer 209, and a p-InP layer 210 are selectively grown. Finally, the $SiO_2$ mask 207 is removed, and a p-InP cladding 211 and a p-InGaAs cap layer 212 are then grown by selective MOVPE. The details of the steps shown in FIGS. 29B to 29E are described in "IEEE Journal of Quantum Electron" vol. 35 No. 3, pp 368–376.

Next, as shown in FIG. 30, a p electrode 214 is patterned using the SiO$_2$ layer 212 as the interlayer film. Further, the backside is polished until the thickness of the n-InP substrate 210 reaches 100 μm, followed by the formation of an n-type electrode 215. Thereafter, devices having a length of 400 μm are taken off. Further, a high reflective layer having a reflectance of 95% is coated on the rear end face of the DFB laser, while an antireflection layer having a reflectance of not more than 0.1% is coated on the front end face. Thus, an optical semiconductor device is completed.

Next, the results of evaluation of the optical semiconductor device according to the second preferred embodiment of the invention will be explained.

Figure 31:
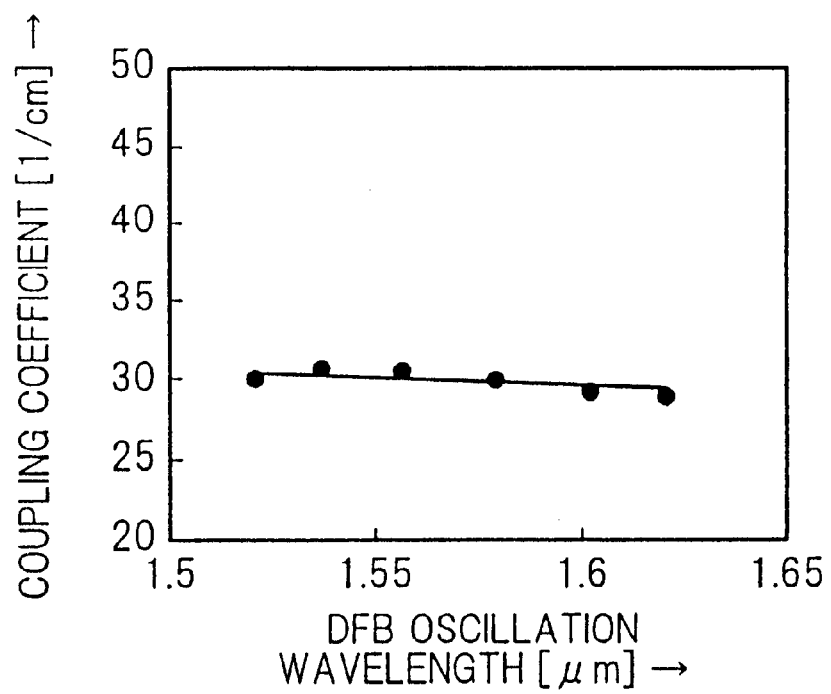
FIG. 31 is a characteristic diagram showing the results of measurement of the coupling coefficient κ as a function of the DFB oscillation wavelength according to the second preferred embodiment of the invention.

FIG. 31 shows the results of measurement of the DFB oscillation wavelength and the coupling coefficient κ of the optical semiconductor device wherein DFB lasers with different wavelengths have been simultaneously formed by the production process shown in FIGS. 26 to 30. As shown in FIG. 23, the DFB oscillation wavelengths of 125 devices thus prepared are continuously assigned, and it can be confirmed that, from channel 1 to channel 125, the wavelength is increased at a slope of 0.8 nm/channel as substantially designed and that devices with different wavelengths covering a wavelength range of 1,520 to 1,620 nm (1.52 to 1.62 μm is realized on a single substrate 201. Therefore, the coupling coefficient κ does not depend upon the oscillation wavelength, and, as is apparent from FIG. 31, is substantially maintained at a value of 30.0 cm$^{-1}$ as designed. Thus, for all the devices with different oscillation wavelengths, a high level of homogeneity could be attained such that the threshold of laser oscillation was 5.0±0.25 mA, the luminous efficiency was 0.35±0.05 W/A, and the maximum light output was 60 ±3 mW.

Figure 32:
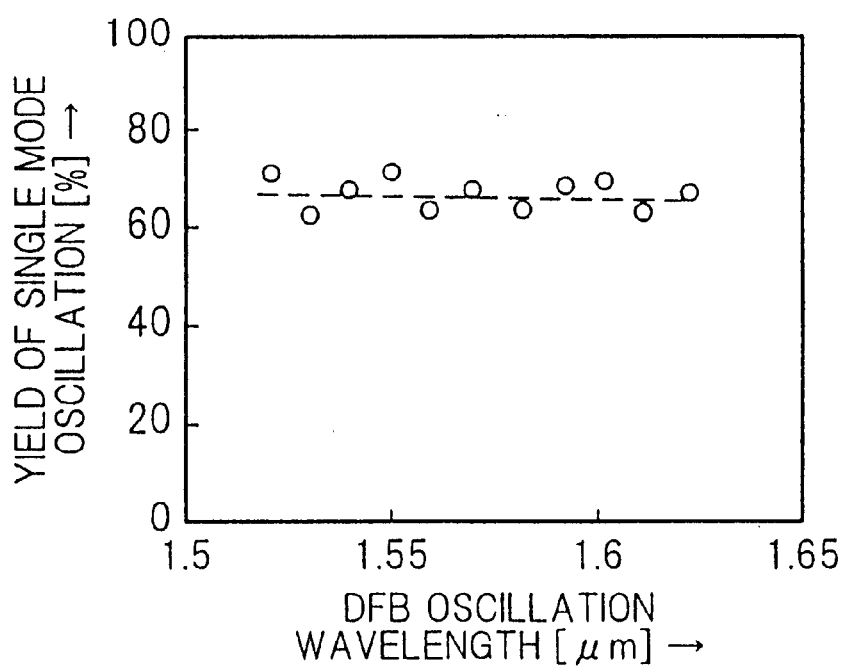
FIG. 32 is a characteristic diagram showing the yield of single longitudinal mode oscillation measured as a function of the DFB oscillation wavelength according to the second preferred embodiment of the invention.
Figure 33A:
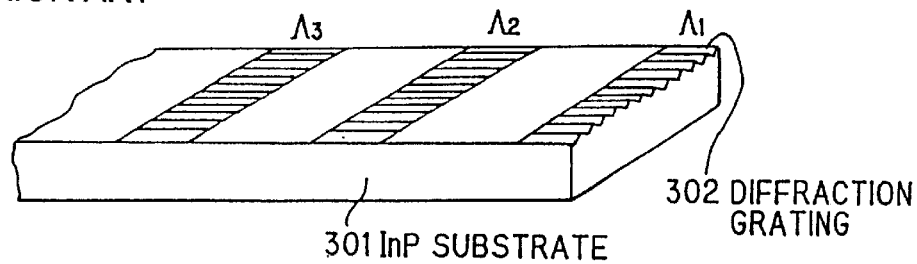
FIGS. 33A–33D is an explanatory view showing a conventional production process of an optical semiconductor device.
Figure 33B:
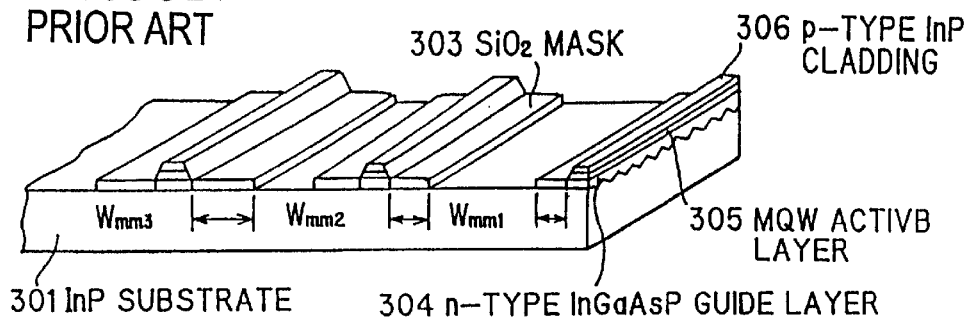
Figure 33C:
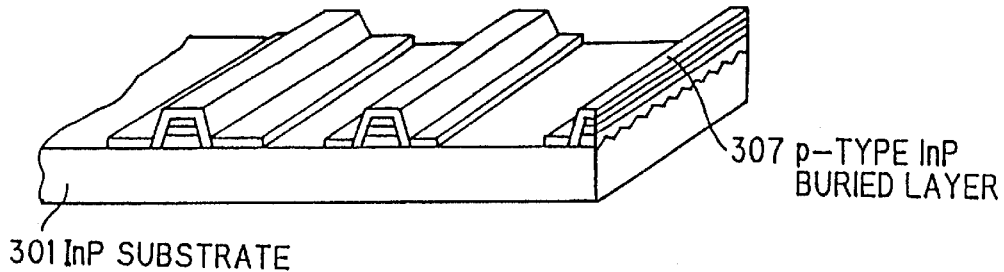
Figure 33D:
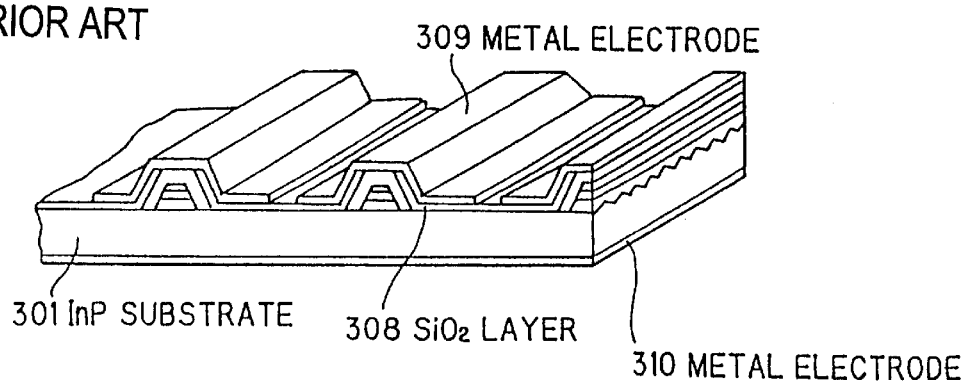

FIG. 32 shows the yield of single longitudinal mode oscillation measured as a function of the DFB oscillation wavelength. As is apparent from FIG. 32, the yield of the longitudinal single mode does not depend upon the DFB oscillation wavelength, and was as good as not less than 65%.

Although DFB lasers nave been described above, the invention can be extensively applied to semiconductor layers having a correlation between the coupling coefficient and the oscillation wavelength. The invention can also be applied, for example, to DBR (distributed bragg reflector) lasers. Furthermore, in addition to structures involving a periodic change in refractive index, structures involving a periodic change in gain, for example, gain coupling DFB lasers, are also contemplated in the invention. Although only the method for homogenizing κ in the case where the coupling coefficient κ increases with increasing the oscillation wavelength has been described above, it is needless to say that, also in the case wherein the coupling coefficient κ decreases with increasing the oscillation wavelength, κ can be homogenized in the same manner. In the examples, although only homogeneous diffraction grating type lasers were used as the DFB laser, the invention can also be applied to DFB lasers having a phase shift region in the diffraction grating.

As described above, in the optical semiconductor device and the process for producing the same according to the invention, for the semiconductor lasers with different oscillation wavelengths, the coupling coefficient has been made identical independently of the oscillation wavelength, Therefore, the heterogeneity of the threshold current of laser oscillation and the luminous efficiency has been eliminated, and this contributes to improved yield of devices and yield of longitudinal single mode oscillation. Further, a variation in yield of transmission characteristics depending upon the wavelength can be eliminated even in the case of the high-speed, long-distance transmission.

The invention has been described in detail with particular reference to preferred embodiments, but it will be understood that variations and modifications can be effected within the scope of the invention as set forth in the appended claims.

What is claimed is:

1. An optical semiconductor device comprising:
   a first semiconductor laser; and
   a second semiconductor laser,
   wherein said first and second semiconductor lasers oscillate longitudinal single mode laser beams based on a periodic change in refractive index or a periodic change in gain,
   said first and second semiconductor lasers have been simultaneously formed with mutually different oscillation wavelengths on a single substrate, and
   said first and second semiconductor lasers are identical to each other in coupling coefficient independently of the oscillation wavelength.

2. An optical semiconductor device comprising:
   a first semiconductor laser; and
   a second semiconductor laser,
   wherein said first and second semiconductor lasers oscillate longitudinal single mode laser beams based on a periodic change in refractive index or a periodic change in gain,
   said first and second semiconductor lasers have been simultaneously formed with mutually different oscillation wavelengths on a single substrate, and
   said first and second semiconductor lasers are provided with diffraction gratings having heights corresponding respectively to the oscillation wavelengths, whereby said first and second semiconductor lasers are configured to be identical to each other in coupling coefficient.

3. The optical semiconductor device according to claim 2, wherein at least one of said first and second semiconductor lasers is a distributed feedback (DFB) semiconductor laser or a distributed bragg reflector (DBR) semiconductor laser.

4. The optical semiconductor device according to claim 2, wherein at least one of said first and second semiconductor lasers comprises a laser active layer comprising a guide layer and a multiple quantum well (MQW) layer.

* * * * *

UNITED STATES PATENT AND TRADEMARK OFFICE
CERTIFICATE OF CORRECTION

PATENT NO. : 6,707,839 B1
DATED : March 16, 2004
INVENTOR(S) : Yasutaka Sakata

It is certified that error appears in the above-identified patent and that said Letters Patent is hereby corrected as shown below:

<u>Column 1,</u>
Line 55, change "117040/1999" to -- 117040/1998 --.

Signed and Sealed this

Twenty-first Day of June, 2005

JON W. DUDAS
*Director of the United States Patent and Trademark Office*